United States Patent
Fukuda

(10) Patent No.: US 8,918,971 B2
(45) Date of Patent: Dec. 30, 2014

(54) METHOD OF MANUFACTURING PACKAGES

(75) Inventor: Junya Fukuda, Chiba (JP)

(73) Assignee: SII Crystal Technology Inc., Chiba (JP)

( * ) Notice: Subject to any disclaimer, the term of this patent is extended or adjusted under 35 U.S.C. 154(b) by 229 days.

(21) Appl. No.: 13/177,898

(22) Filed: Jul. 7, 2011

(65) Prior Publication Data
US 2011/0261659 A1    Oct. 27, 2011

Related U.S. Application Data

(63) Continuation of application No. PCT/JP2009/050437, filed on Jan. 15, 2009.

(51) Int. Cl.
| | | |
|---|---|---|
| *H01L 21/52* | (2006.01) | |
| *H03H 3/02* | (2006.01) | |
| *H01L 21/78* | (2006.01) | |
| *H01L 21/50* | (2006.01) | |
| *H03H 3/04* | (2006.01) | |
| *H03H 9/10* | (2006.01) | |
| H01L 27/146 | (2006.01) | |
| H01L 51/56 | (2006.01) | |
| H01L 23/055 | (2006.01) | |
| H03H 9/21 | (2006.01) | |
| H03H 9/24 | (2006.01) | |

(52) U.S. Cl.
CPC ............... *H01L 21/52* (2013.01); *H01L 21/78* (2013.01); *H03H 3/02* (2013.01); *H01L 21/50* (2013.01); *H03H 3/04* (2013.01); *H03H 9/1021* (2013.01); *H01L 27/14618* (2013.01); *H01L 27/14632* (2013.01); *H01L 51/56* (2013.01); *H01L 23/055* (2013.01); *H03H 9/21* (2013.01); *H03H 9/2494* (2013.01); *H03H 2003/026* (2013.01); *H03H 2003/0492* (2013.01)
USPC ............... 29/25.35; 29/830; 29/417; 438/26; 438/33; 438/113

(58) Field of Classification Search
CPC ......... H01L 21/50; H01L 21/52; H01L 21/78; H01L 27/14618; H01L 27/14632; H01L 51/56; H03H 3/02; H03H 3/04; H03H 9/1021; H03H 2003/026; H03H 9/21; H03H 9/2494; H03H 23/055; H03H 2003/0492
USPC ............. 29/25.35, 830, 412, 417; 438/25, 26, 438/33, 110, 113; 257/99, 100, 684
See application file for complete search history.

(56) References Cited

U.S. PATENT DOCUMENTS

| | | | |
|---|---|---|---|
| 6,982,180 B2 * | 1/2006 | Hishida | 438/25 X |
| 6,982,470 B2 * | 1/2006 | Omori | 257/99 X |

(Continued)

FOREIGN PATENT DOCUMENTS

| | | | |
|---|---|---|---|
| JP | 2002-121037 A | | 4/2002 |
| JP | 2003243962 A | * | 8/2003 |

(Continued)

OTHER PUBLICATIONS

International Search Report for international Application No. PCT/JP2009/050437, dated Feb. 10, 2009, 1 page.

*Primary Examiner* — A. Dexter Tugbang
(74) *Attorney, Agent, or Firm* — Brinks Gilson & Lione

(57) ABSTRACT

A method of manufacturing packages having contents sealed therein, including: a step of forming cavities in a plurality of package forming areas on a first wafer; a step of bonding the first wafer and a second wafer while arranging the contents in the cavities; and a step of irradiating a bonded wafer member with a laser and separating the packages into pieces, characterized in that dummy cavities are formed on an outside of the package forming area in an outermost periphery of the first wafer in the cavity forming step.

5 Claims, 16 Drawing Sheets

(56) References Cited

U.S. PATENT DOCUMENTS 7,179,723 B2 * 2/2007 Genda et al. ............... 438/33 X
2007/0166883 A1 * 7/2007 Wang ........................... 438/113

FOREIGN PATENT DOCUMENTS

| JP | 2007-013628 A | 1/2007 |
| JP | 2008-093880 A | 4/2008 |

* cited by examiner

METHOD OF MANUFACTURING PACKAGES

RELATED APPLICATIONS

This application is a continuation of PCT/JP2009/050437 filed on Jan. 15, 2009. The entire content of this application is incorporated herein by reference.

BACKGROUND OF THE INVENTION

1. Field of the Invention

The present invention relates to a method of manufacturing packages, a bonded wafer member, a piezoelectric vibrator, an oscillator, an electronic apparatus, and a radio timepiece.

2. Description of the Related Art

In recent years, a piezoelectric vibrator using crystal or the like is used as a time instance source, a timing source for control signals or the like, and a reference signal source or the like in mobile phone sets or portable information terminal devices. Various types of such piezoelectric vibrators are known, and a surface mount (SMD) type piezoelectric vibrator is known as one of these piezoelectric vibrators. The piezoelectric vibrator of this type includes, for example, a base substrate and a lid substrate bonded to each other, and a cavity formed between these substrates, and a piezoelectric vibration reed (content) stored in the cavity sealed in an air-tight manner.

Here, when manufacturing the piezoelectric vibrator described above, as shown in Patent Documents 1 and 2, for example, a depressed portion for a cavity is formed on a lid substrate wafer (second wafer) and a piezoelectric vibration reed is mounted on a base substrate wafer (first wafer), and then the both wafers are bonded to form a bonded wafer member formed with a plurality of packages arranged in row and column directions of the wafers. Then, by cutting the bonded wafer member into individual packages (individual cavities) formed on the bonded wafer member, a plurality of piezoelectric vibrators (packages) each having a piezoelectric vibration reed airtightly sealed in the cavity are manufactured.

Incidentally, as methods of cutting the bonded wafer member, methods employing, for example, a blade or a laser or the like are known.

However, the method of cutting using the blade has problems such that cutting margins are needed to provide between the cavities considering the width of the blade, and that chippings are generated at the time of cutting and cutting surfaces are coarse or the like.

Patent Document 1: JP-A-2002-121037
Patent Document 2: JP-A-2007-13628

Here, a method of cutting a bonded wafer member using a laser will be described in brief. FIG. 18 is a plan view of a bonded wafer member for explaining a method of cutting using a laser in the related art. For reference sake, a broken line L in the drawing is a contour line when a package is irradiated with a laser along a contour thereof, and a solid line L' shows a scribe line formed when being irradiated actually with the laser.

As shown in FIG. 18, a bonded wafer member 150 is provided with respective cavities 153 formed between both substrate wafers 151, 152 and arranged in a plurality of rows and plurality of columns along the direction of plane except for an outer peripheral portion of the bonded wafer member 150. Then, piezoelectric vibration reeds (not shown) are mounted respectively in the respective cavities 153 to constitute a plurality of piezoelectric vibrators. Incidentally, the outermost peripheral portion of the bonded wafer member 150 is an area where the cavities 153 are not formed because it is used for clamping or the like when bonding the both substrate wafers 151, 152, for example. In other words, in the bonded wafer member 150, the area of the outer peripheral portion where the cavities 153 are not formed corresponds to a non-cavity formed area Y' and an inside area surrounded by the non-cavity formed area Y' corresponds to a cavity formed area X' having the cavities 153.

Then, when cutting the bonded wafer member 150 by the laser, for example, a front surface of the substrate wafer 151 on one side is irradiated and scanned with a laser and formed with grooves (scribe line) having a predetermined depth, and then an impact is applied to the substrate wafer 152 on the other side along the scribe lines from a back surface thereof, thereby braking and cutting the same. In this manner, a plurality of the piezoelectric vibrators can be manufactured at once from the bonded wafer member 150. In this case, the method of cutting using a laser has such advantages that the cutting margin is significantly smaller than that in the method of cutting using a blade, that the cutting speed is high, and the coarseness of the cutting surfaces are preferable or the like.

Incidentally, when the laser is scanned along contour lines L, in the cutting step described above, desired scribe lines L' can be formed along the contour lines L in a center portion of the cavity formed area X'.

However, there is a problem that the scribe lines L' are curved with respect to the contour lines L because of the reason such that energies given by the laser vary or the like in the vicinity of a boundary portion from the cavity formed area X' to the non-cavity formed area Y'.

If the scribe lines L' are curved inside the non-cavity formed area Y', there arises a problem that the piezoelectric vibrators cannot be cut into a predetermined size in the outermost peripheral portion of the wafer 152. In other words, since the scribe lines L' may be formed on the cavities 153, for example, the interiors of the cavity 153 and the outside may communicate after having cut the bonded wafer member 150, so that the interiors of the cavities 153 may not be hermetically sealed.

Consequently, there arises a problem that the number of the piezoelectric vibrators taken out as conforming articles from a single bonded wafer member 150 is lowered with respect to the piezoelectric vibration reeds mounted in the cavities 153, so that the process yield is lowered.

SUMMARY OF THE INVENTION

In view of such problems, the present invention provides a method of manufacturing packages which can improve the process yield by cutting a plurality of packages formed on a bonded wafer member into pieces of a predetermined size, the bonded wafer member, a piezoelectric vibrator, an oscillator, an electronic apparatus, and a radio timepiece.

In order to solve the above-described problems, the present invention provides the following means.

A method of manufacturing packages according to the present invention is a method of manufacturing packages having contents sealed therein, including: a step of forming cavities in a plurality of package forming areas on a first wafer; a step of bonding the first wafer and a second wafer while arranging the contents in the cavities; and a step of irradiating a bonded wafer member bonded to each other with a laser and separating the packages into pieces, characterized in that dummy cavities are formed on an outside of the package forming area in an outermost periphery of the first wafer in the cavity forming step.

In this configuration, by forming the dummy cavities having no content sealed therein on the outside of the package forming areas on the outermost periphery, the position where the laser starts to curve can be arranged on the outside of the package forming areas in the outermost periphery. In other words, the laser starts to curve at a position where the laser is about to get into the areas of the dummy cavities to an area where the dummy cavities are not formed. Accordingly, in the cavities that is, in the package forming areas arranged inside the dummy cavities, desired positions along contours of the packages can be irradiated with the laser.

Therefore, in the package forming areas, the plurality of packages formed on the both wafers can be cut into pieces of a predetermined size. Therefore, the number of the packages taken out from the both wafers bonded to each other as conforming articles can be increased, so that the process yield can be improved. In this case, since the contents are not sealed in the dummy cavities in advance, loss of the contents is avoided, and hence the material cost can be reduced.

Also, the packages which are not the predetermined size are not manufactured, and only high-performance packages can be manufactured. Therefore, defective products are not put into circulation and only the packages with high reliability are put into circulation.

Also, the dummy cavities are characterized by including first dummy cavities which come into contact with edge sides of the package forming areas in the outermost periphery as well as second dummy cavities which come into contact only with corner portions of the package forming areas in the outermost periphery.

In this configuration, the dummy cavities surround the package forming areas completely by forming the first dummy cavities which come into contact with the edge sides of the package forming areas in the outermost periphery as well as the second dummy cavities which come into contact only with the corner portions of the package forming areas in the outermost periphery. Therefore, the positions where the laser starts to curve can be arranged further outside, and hence the process yield can be improved further reliably.

Also, the first wafer and the second wafer are both characterized by being formed of a glass substrate.

In this configuration, by separating the wafer formed of the glass substrate into pieces using the laser, preferable cutting surfaces are obtained.

Also, the cutting step is characterized by including a groove forming step for irradiating with the laser from the side of a front surface of one wafer from the first wafer and the second wafer and forming a groove on the front surface of the one wafer, and a braking step for separating the both wafers into the packages by applying an impact force along the groove from a back surface of the other wafer.

In this configuration, by separating the packages along the scribe lines, the plurality of packages can be separated into pieces of a predetermined size at once from the both wafers bonded to each other. In particular, advantages such that the cutting margin is significantly smaller, the cutting speed is higher, and the coarseness of the cutting surface is more preferable, the amount of generated chippings is smaller, and so on in comparison with the cutting method using a blade in the related art are achieved.

Also, a bonded wafer member according to the present invention is a bonded wafer member including cavities having contents sealed therein in a plurality of package forming areas of a first wafer and a second wafer bonded to each other, characterized in that dummy cavities are formed on an outside of the package forming areas in an outermost periphery.

In this configuration, by forming the dummy cavities having no contents sealed therein on the outside of the package forming areas in the outermost periphery, when separating the bonded wafer member into a plurality of packages by a laser, the plurality of packages formed on the bonded wafer member can be cut into pieces of a predetermined size in the package forming area.

Therefore, the number of the packages taken out from the bonded wafer member as conforming articles can be increased, so that the process yield can be improved. In this case, since the contents are not sealed in the dummy cavity in advance, loss of the contents is avoided, and hence the material cost can be reduced.

Also, the packages which are not the predetermined size are not manufactured, and only high-performance packages can be manufactured. Therefore, defective products are not put into circulation and only the packages with high reliability are put into circulation.

A piezoelectric vibrator according to the present invention is characterized by being manufactured by a method of manufacturing packages according to the present invention described above.

In this configuration, since the piezoelectric vibrator is manufactured by the method of manufacturing packages according to the present invention described above, highly precise piezoelectric vibrators formed into a predetermined size can be provided.

Also, an oscillator according to the present invention includes the piezoelectric vibrator according to the present invention described above electrically connected to an integrated circuit as an oscillation element.

Also, an electronic apparatus according to the present invention includes the piezoelectric vibrator according to the present invention described above electrically connected to a clocking unit.

Also, a radio timepiece according to the present invention includes the piezoelectric vibrator according to the present invention described above electrically connected to a filtering unit.

In the oscillator, the electronic apparatus and the radio timepiece according to the present invention, since the piezoelectric vibrator described above is provided, increase in quality can be achieved in the same manner as the piezoelectric vibrator.

According to the method of manufacturing packages and the bonded wafer member in the present invention, the number of the packages taken out from the bonded wafer member as conforming articles can be increased, so that the process yield can be improved.

Also, according to the piezoelectric vibrator in the present invention, highly precise piezoelectric vibrators formed into a predetermined size can be provided since they are formed by separating the bonded wafer member in the present invention described above.

In the oscillator, the electronic apparatus and the radio timepiece according to the present invention, since the piezoelectric vibrator described above is provided, increase in quality can be achieved for a long term in the same manner as the piezoelectric vibrator.

DETAILED DESCRIPTION OF THE PREFERRED EMBODIMENTS

Figure 1:
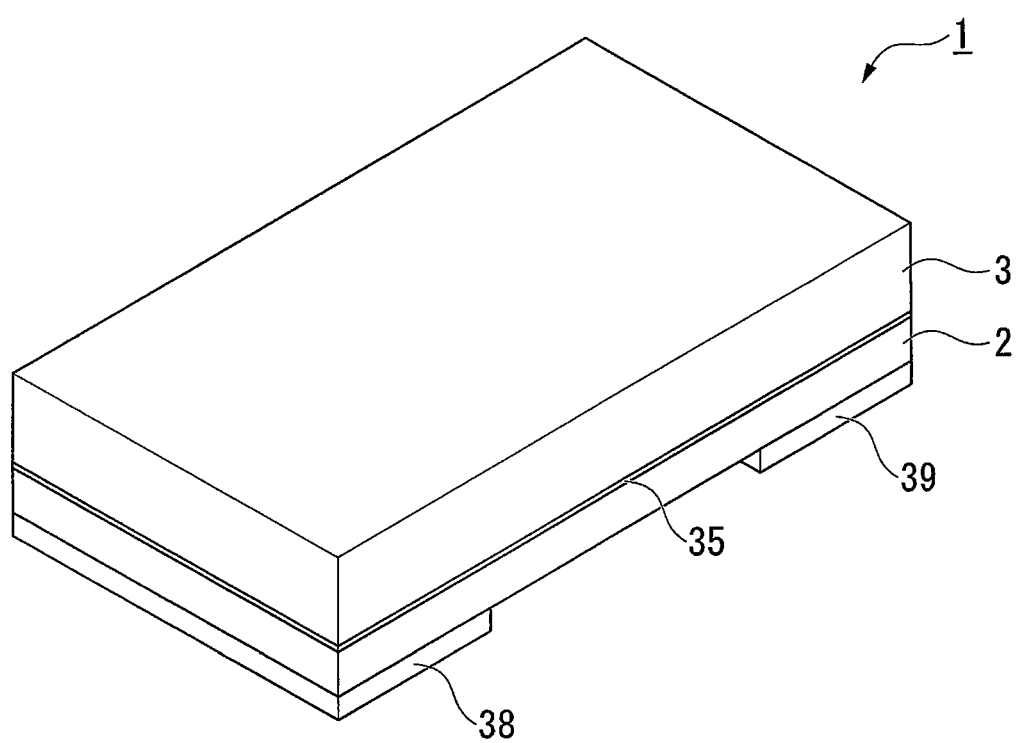
FIG. 1 is an appearance perspective view showing an embodiment of a piezoelectric vibrator according to the present invention.

Referring now to the drawings, an embodiment of the present invention will be described.
(Piezoelectric Vibrator)

Figure 2:
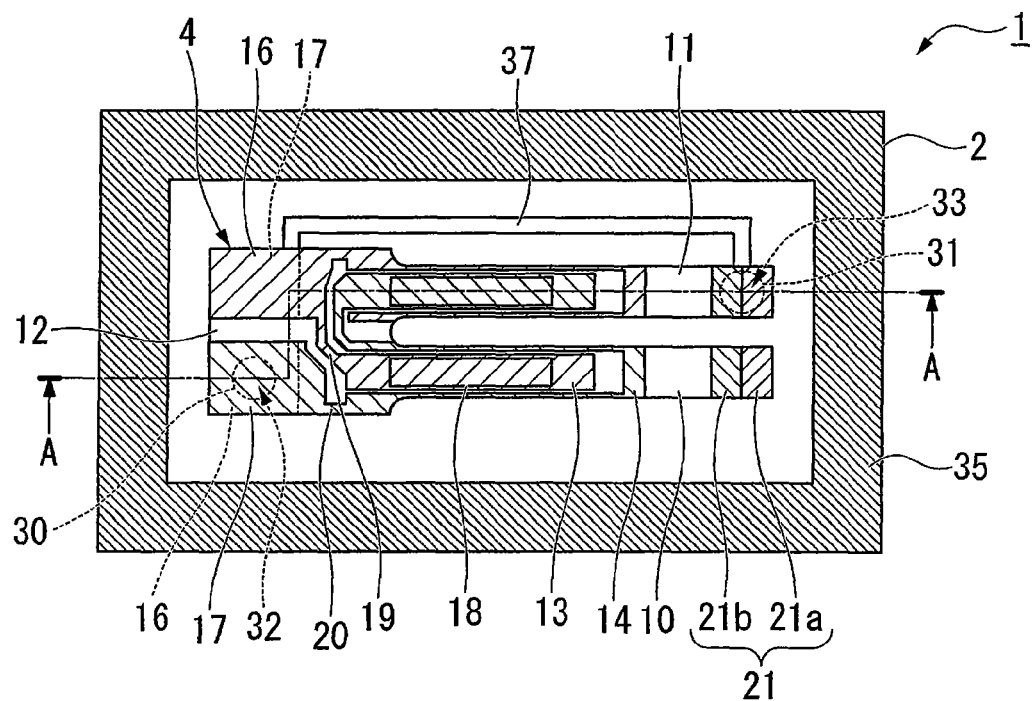
FIG. 2 is a drawing showing an internal configuration of the piezoelectric vibrator shown in FIG. 1 and is a drawing of a piezoelectric vibration reed viewed from above in a state in which a lid substrate is removed.
Figure 3:
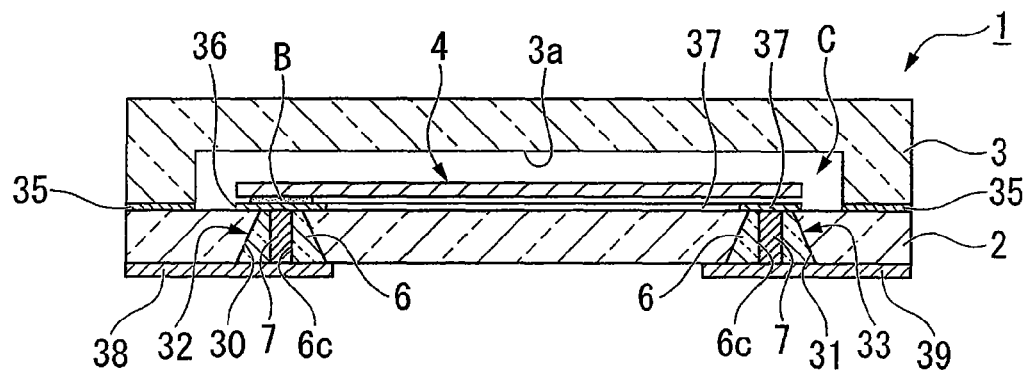
FIG. 3 is a cross-sectional view of the piezoelectric vibrator taken along the line A-A shown in FIG. 2.
Figure 4:
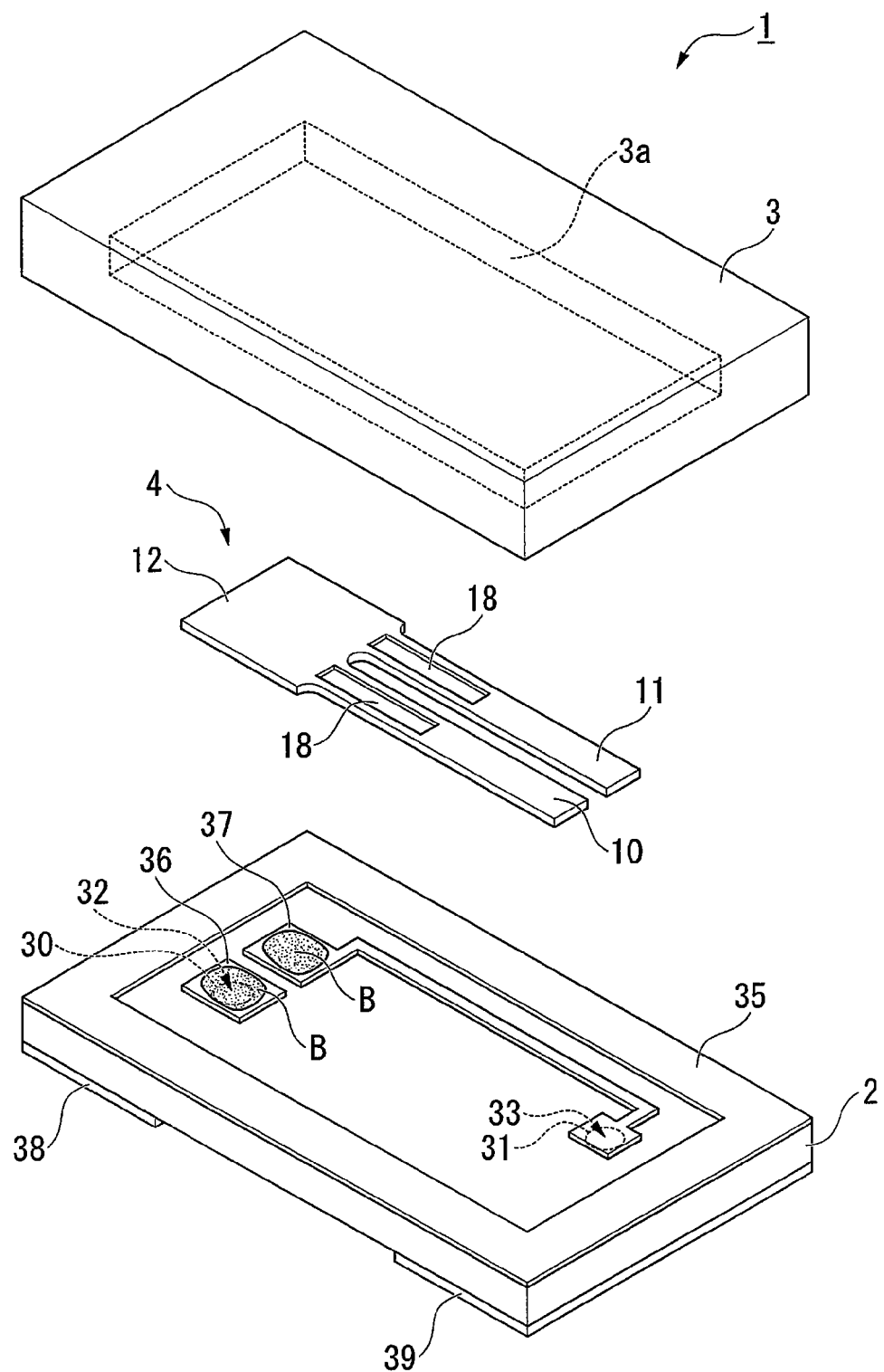
FIG. 4 is an exploded perspective view of the piezoelectric vibrator shown in FIG. 1.

FIG. 1 is an appearance perspective view of a piezoelectric vibrator in the present invention, and FIG. 2 is a drawing showing an internal configuration of the piezoelectric vibrator showing a piezoelectric vibration reed viewed from above in a state in which a lid substrate is removed. Also, FIG. 3 is a cross-sectional view of the piezoelectric vibrator taken along the line A-A shown in FIG. 2. FIG. 4 is an exploded perspective view of the piezoelectric vibrator.

As shown in FIG. 1 to FIG. 4, a piezoelectric vibrator 1 in this embodiment is a surface mount type piezoelectric vibrator formed into a box shape with a base substrate 2 and a lid substrate 3 laminated into two layers, and including a piezoelectric vibration reed 4 stored in a cavity C in the interior thereof. In FIG. 4, for the sake of easy understanding of the drawing, illustration of an excitation electrode 15, drawn electrodes 19, 20, mount electrodes 16, 17, and a weight metal film 21, described later, is omitted.

Figure 5:
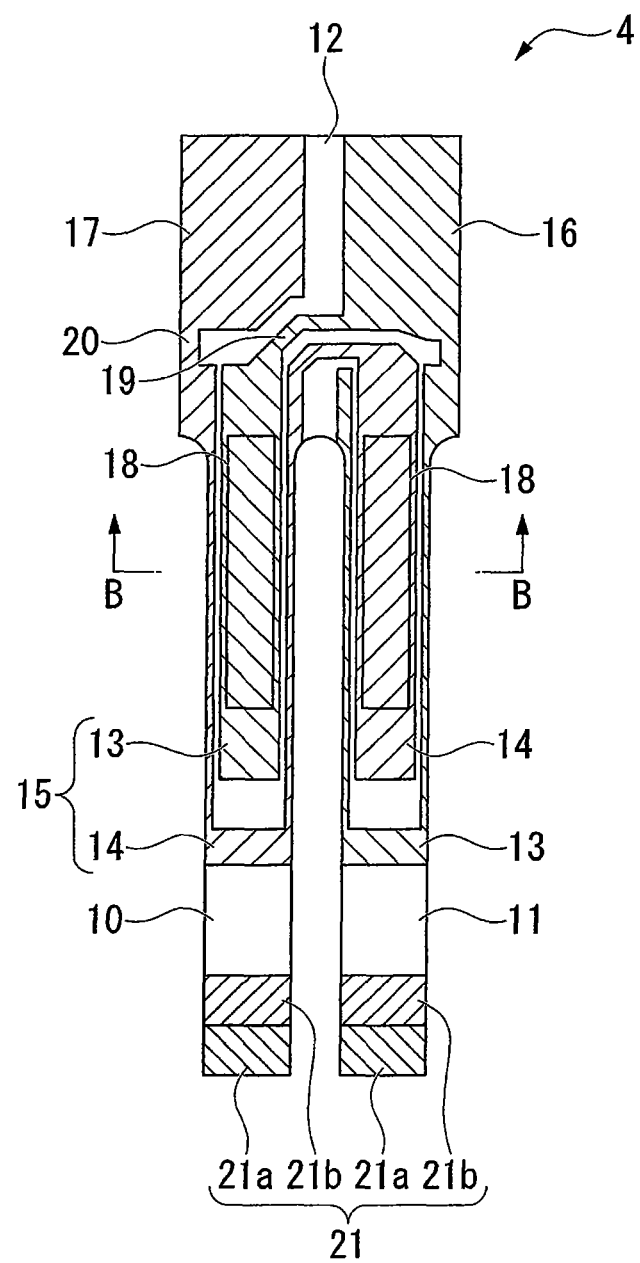
FIG. 5 is a top view of the piezoelectric vibration reed which constitutes the piezoelectric vibrator shown in FIG. 1.
Figure 6:
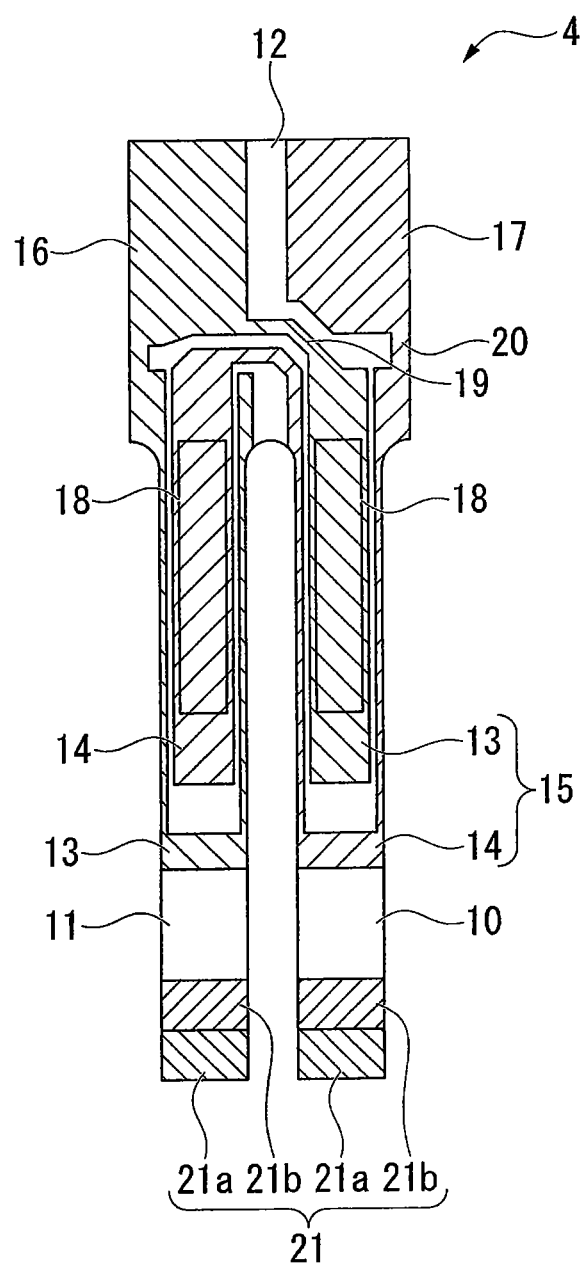
FIG. 6 is a bottom view of the piezoelectric vibration reed shown in FIG. 5.
Figure 7:
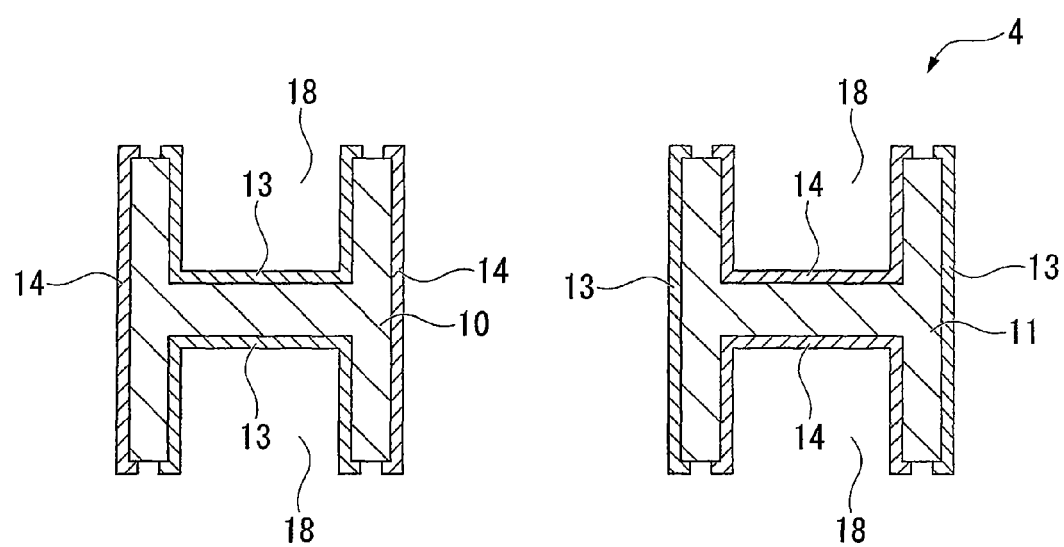
FIG. 7 is a cross-sectional view taken along the line B-B shown in FIG. 5.

FIG. 5 is a top view of the piezoelectric vibration reed which constitutes the piezoelectric vibrator, FIG. 6 is a bottom view, and FIG. 7 is a cross-sectional view taken along the line B-B in FIG. 5.

As shown in FIGS. 5 to 7, the piezoelectric vibration reed 4 is a vibration reed having a tuning fork type formed of piezoelectric material such as crystal, lithium tantalite, or lithium niobate and is configured to vibrate when a predetermined voltage is applied thereto.

The piezoelectric vibration reed 4 includes: a pair of vibrating arm portions 10, 11 arranged in parallel; a base member 12 configured to integrally fix proximal end sides of the pair of vibrating arm portions 10, 11; the excitation electrodes 15 including a first excitation electrode 13 and a second excitation electrode 14 formed on outer surfaces of the pair of vibrating arm portions 10, 11 for vibrating the pair of vibrating arm portions 10, 11; and the mount electrodes 16, 17 electrically connected to the first excitation electrode 13 and the second excitation electrode 14.

Also, the piezoelectric vibration reed 4 in this embodiment also includes groove portions 18 formed respectively on both main surfaces of the pair of vibrating arm portions 10, 11 along a longitudinal direction of the vibrating arm portions 10, 11. The groove portion 18 is formed from the proximal end sides of the vibrating arm portions 10, 11 to substantially midsections thereof.

The excitation electrodes 15 including the first excitation electrodes 13 and the second excitation electrodes 14 are an electrode which causes the pair of vibrating arm portions 10, 11 to vibrate in the direction toward and apart from each other at a predetermined resonance frequency and are formed by patterning on the outer surfaces of the pair of vibrating arm portions 10, 11 in a state of being electrically disconnected respectively. More specifically, the first excitation electrodes 13 are mainly formed on the groove portions 18 of the one vibrating arm portion 10 and on both side surfaces of the other vibrating arm portion 11, and the second excitation electrodes 14 are mainly formed on both side surfaces of the one vibrating arm portion 10 and the groove portions 18 of the other vibrating arm portion 11.

Also, the first excitation electrodes 13 and the second excitation electrodes 14 are electrically connected to the mount electrodes 16, 17 via the drawn electrodes 19, 20 respectively on both main surfaces of the base member 12. Then, the piezoelectric vibration reed 4 is configured to be applied with a voltage via the mount electrodes 16, 17.

For reference sake, the excitation electrodes 15, the mount electrodes 16, 17, and the drawn electrodes 19, 20 described above are formed of films such as conductive films formed of, for example, chrome (Cr), nickel (Ni), Aluminum (Al) or Titan (Ti) or the like.

Also, distal ends of the pair of vibrating arm portions 10, 11 are each coated with the weight metal film 21 for adjusting (frequency adjustment) the vibrating state of themselves to vibrate within a range of a predetermined frequency. For reference sake, the weight metal film 21 is divided into a coarse adjustment film 21a used when adjusting the frequency coarsely and a fine adjustment film 21b used when adjusting the same finely. By performing the frequency adjustment using the coarse adjustment film 21a and the fine adjustment film 21b, the frequencies of the pair of vibrating arm portions 10, 11 can be adjusted to fall within a range of the nominal frequency of the device.

The piezoelectric vibration reed 4 configured in this manner is bonded by bump bonding to an upper surface of the base substrate 2 while utilizing a bump B such as gold, as shown in FIGS. 3 and 4. More specifically, a pair of the mount electrodes 16, 17 are bonded onto the two bumps B formed on drawing electrodes 36, 37, described later, patterned on the upper surface of the base substrate 2 by bump bonding in a state of being in contact with each other, respectively. Accordingly, the piezoelectric vibration reed 4 is supported in a state of being lifted from the upper surface of the base substrate 2, and a state in which the mount electrodes 16, 17 and the drawing electrodes 36 and 37 are electrically connected respectively is achieved.

The lid substrate 3 described above is a transparent insulated substrate formed of glass material, for example, of soda lime glass, and is formed into a plate shape as shown in FIGS. 1, 3, 4. Then, a rectangular shaped depressed portion 3a for storing the piezoelectric vibration reed 4 is formed on the bonding surface side where the base substrate 2 is bonded. The depressed portion 3a is a depressed portion for cavity which defines the cavity C for storing the piezoelectric vibration reed 4 when the both base substrates 2, 3 are placed on top of another. Then, the lid substrate 3 is anodically bonded to the base substrate 2 in a state in which the depressed portion 3a is opposed to the base substrate 2.

The base substrate 2 described above is a transparent insulated substrate formed of glass material, for example, soda lime glass in the same manner as the lid substrate 3, and is formed into a plate shape having a size which can be overlapped with the lid substrate 3 as shown in FIGS. 1 to 4.

The base substrate 2 is formed with a pair of through holes 30, 31 penetrating through the base substrate 2. In this case, the pair of through holes 30, 31 are formed so as to be included in the interior of the cavity C. More specifically, the through holes 30, 31 in this embodiment are formed in such a manner that the through hole 30 on one side is formed at a position corresponding to the base member 12 side of the mounted piezoelectric vibration reed 4, and the through hole 31 on the other side is formed at a position corresponding to distal end sides of the vibrating arm portions 10, 11. Also, although the through hole having a tapered cross section is described as it is reduced in diameter gradually from a lower surface toward the upper surface of the base substrate 2 in this embodiment, the invention is not limited thereto, and it may be a through hole penetrating straight through the base substrate 2. In any cases, it may be of any shape as long as it penetrates through the base substrate 2.

Then, the pair of through holes 30, 31 are formed with a pair of through electrodes 32, 33 formed so as to fill in the through holes 30, 31. These through electrodes 32, 33 are made up of a cylindrical member 6 and a core member 7 fixed integrally to the through holes 30, 31 by baking as shown in FIG. 3, and have a role to maintain the hermeticity in the cavity C by completely closing the through holes 30, 31, and bring external electrodes 38, 39, described later into conduction with the drawing electrodes 36, 37.

The cylindrical member 6 is a member formed by baking a paste-like glass frit. The cylindrical member 6 is formed into a cylindrical shape being flat at both ends thereof and having the substantially same thickness as the base substrate 2. Then, the core member 7 is arranged at a center of the cylindrical member 6 so as to penetrate through the cylindrical member 6. Also, in this embodiment, an outline of the cylindrical member 6 is formed into a conical shape (tapered in cross section) so as to fit the shape of the through holes 30, 31.

Then, the cylindrical members 6 are baked in a state of being embedded in the through holes 30, 31, and are firmly secured to the through holes 30, 31.

The above-described core member 7 is a conductive core member formed of a metallic material into a cylindrical shape, and is formed to be flat on both ends thereof in the same manner as the cylindrical member 6 and having the substantially same thickness as the base substrate 2. For reference sake, as shown in FIG. 3, when the through electrodes 32, 33 are formed as finished products, the core member 7 is formed to have a thickness substantially the same as the thickness of the base substrate 2 as described above. However, the core member 7 employed in the process of manufacture has a length of 0.02 mm shorter than the initial thickness of the base substrate 2 in the process of manufacture. Then, the core member 7 is positioned at a center hole 6c of the cylindrical member 6, and is firmly secured to the cylindrical member 6 by baking of the cylindrical member 6.

For reference sake, an electric conductivity of the through electrodes 32, 33 is ensured through the conductive core member 7.

On the side of the upper surface of the base substrate 2 (the side of the bonding surface where the lid substrate 3 is bonded), as shown in FIGS. 1 to 4, a bonding film 35 for anode wafer bonding and a pair of the drawing electrodes 36, 37 are patterned by conductive material (for example, aluminum). The bonding film 35 is formed along a peripheral edge of the base substrate 2 so as to surround the periphery of the depressed portion 3a formed on the lid substrate 3.

Also, the pair of drawing electrodes 36, 37 are patterned so as to electrically connect the through electrode 32, which is one of the through electrodes 32, 33, and one of the mount electrodes 16 of the piezoelectric vibration reed 4, and electrically connect the other through electrode 33 and the other mount electrode 17 of the piezoelectric vibration reed 4.

More specifically, the one drawing electrode 36 is formed right above the one through electrode 32 so as to be positioned right below the base member 12 of the piezoelectric vibration reed 4. In contrast, the other drawing electrode 37 is formed so as to be laid down from a position adjacent to the one drawing electrode 36 along the vibrating arm portions 10, 11 to the distal end sides of the vibrating arm portions 10, 11, and then is positioned right above the other through electrode 33.

Then, the bumps B are formed respectively on the pair of drawing electrodes 36, 37, and the piezoelectric vibration reed 4 is mounted using the bumps B. Accordingly, the one mount electrodes 16 of the piezoelectric vibration reed 4 is brought into conduction with the one through electrode 32 via the one drawing electrode 36, and the other mount electrode 17 is brought into conduction with the other through electrode 33 via the other drawing electrode 37.

Also, as shown in FIGS. 1, 3, 4, the external electrodes 38, 39 which are electrically connected to the pair of through electrodes 32, 33 respectively are formed on the lower surface of the base substrate 2. In other words, the one external electrode 38 is electrically connected to the first excitation electrode 13 of the piezoelectric vibration reed 4 via the one through electrode 32 and the one drawing electrode 36. Also, the other external electrode 39 is electrically connected to the second excitation electrode 14 of the piezoelectric vibration reed 4 via the other through electrode 33 and the other drawing electrode 37.

When activating the piezoelectric vibrator 1 configured in this manner, a predetermined drive voltage is applied to the external electrodes 38, 39 formed on the base substrate 2. Accordingly, an electric current can be flowed to the excitation electrode 15 including the first excitation electrode 13 and the second excitation electrode 14 of the piezoelectric vibration reed 4, so that the pair of vibrating arm portions 10, 11 can be vibrated at a predetermined frequency in the direction toward and apart from each other. Then, the vibration of the pair of vibrating arm portions 10, 11 can be used as a time instance source, a timing source of control signal, a reference signal source, and so on.

(Method of Manufacturing Piezoelectric Vibrator)

Figure 8:
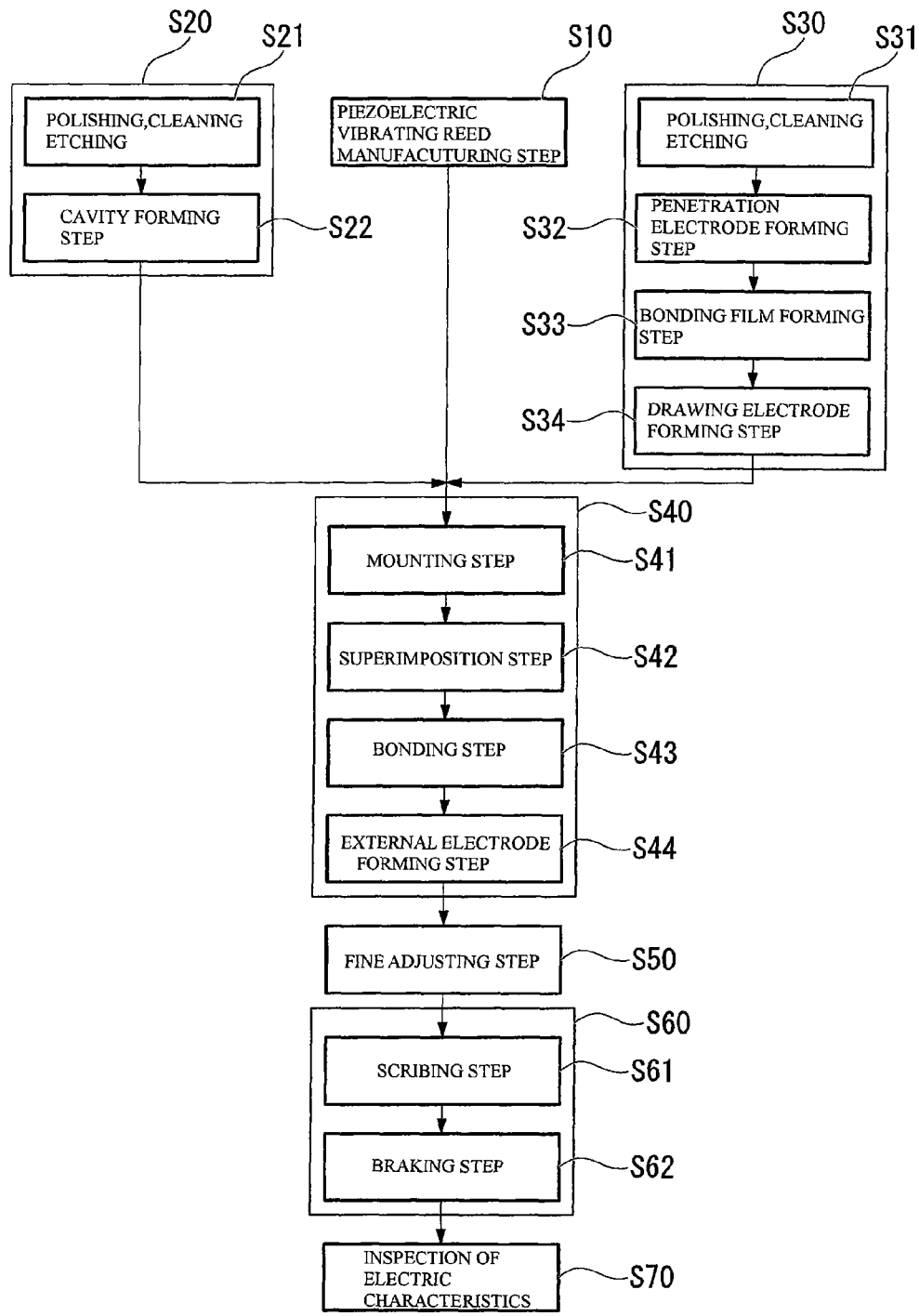
FIG. 8 is a flowchart showing a flow when the piezoelectric vibrator shown in FIG. 1 is manufactured.

Subsequently, referring to a flowchart shown in FIG. 8, a manufacturing method for manufacturing a plurality of the piezoelectric vibrators 1 using a base substrate wafer 40 and a lid substrate wafer 50 at once will be described below.

First of all, a piezoelectric vibration reed fabricating step is performed to fabricate the piezoelectric vibration reed 4 shown in FIGS. 5 to 7 (S10). More specifically, at first, Lambert row stone of crystal is sliced at a predetermined angle to obtain a wafer of a certain thickness. Subsequently, the wafer is wrapped and coarsely machined, then an affected layer is removed by etching, and then mirror grinding such as polishing is performed to obtain a wafer having a predetermined thickness. Subsequently, after having treated the wafer adequately such as washing, patterning of the outer shape of the piezoelectric vibration reed 4 is performed on the wafer and then formation and patterning of the metallic film are performed thereon with photolithography technique, so that the excitation electrodes 15, the drawn electrodes 19, 20, the mount electrodes 16, 17, the weight metal film 12 are formed. Accordingly, the plurality of piezoelectric vibration reeds 4 can be fabricated.

Also, after having fabricated the piezoelectric vibration reed 4, the coarse adjustment of the resonance frequency is performed. This is achieved by irradiating the coarse adjustment film 21a of the weight metal film 21 with a laser beam to cause part of them to evaporate and changing the weight. Fine adjustment for adjusting the resonance frequency with higher degree of accuracy is performed after having mounted.

Figure 9:
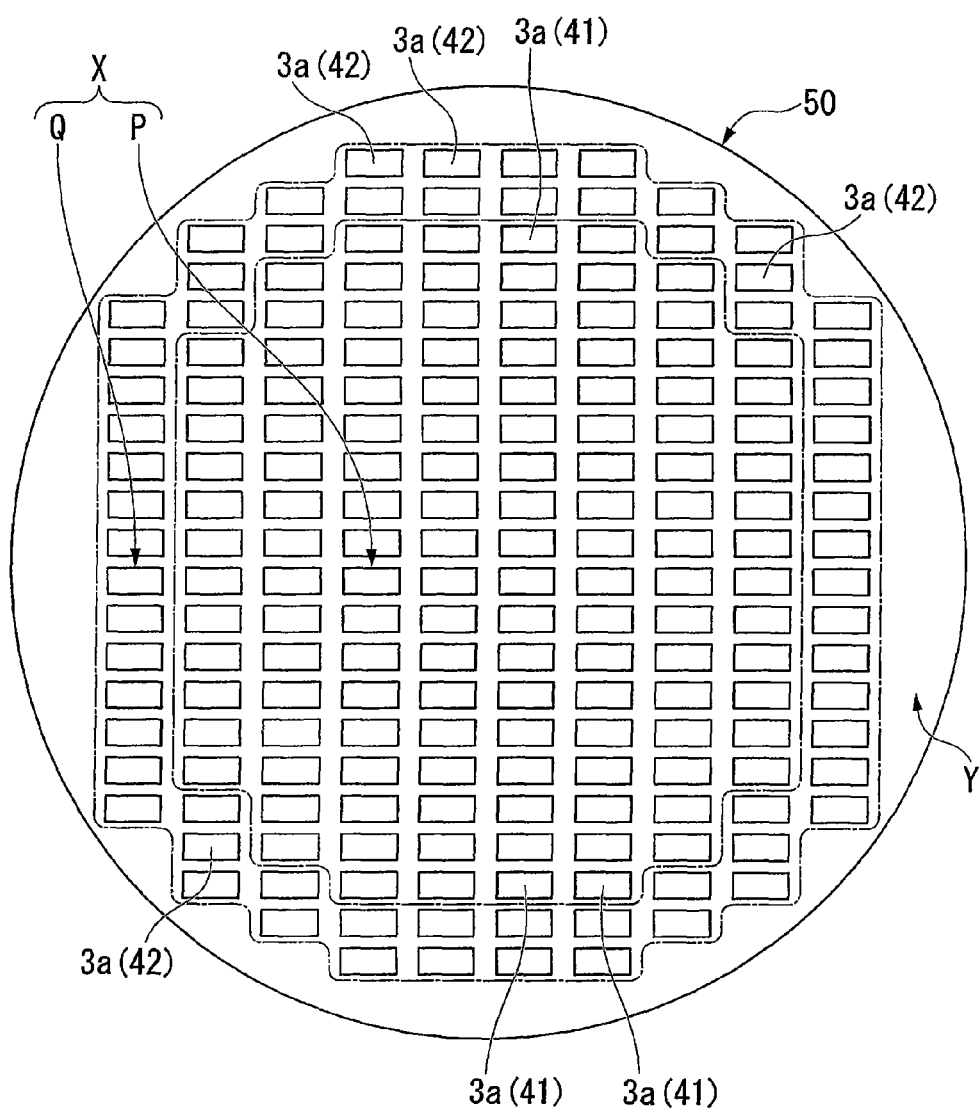
FIG. 9 is a drawing showing a step taken when manufacturing the piezoelectric vibrator according to the flowchart shown in FIG. 8, and is a plan view of a lid substrate wafer.

FIG. 9 is a plan view of a lid substrate wafer.

Subsequently, a first wafer fabricating step (S20) for fabricating the lid substrate wafer 50 which becomes the lid substrate 3 later to a state immediately before performing anodic wafer bonding. First of all, after having ground the soda lime glass to a predetermined thickness and washed the same, as shown in FIG. 9, the lid substrate wafer 50 of a disc shape having the affected layer on the outermost surface thereof removed by etching or the like is formed (S21). Subsequently, a depressed portion forming step (cavity forming step) (S22) which forms a plurality of the depressed portions 3a for cavity in the direction of arrangement of rows by etching or the like in a package forming area on a bonding surface of the lid substrate wafer 50 is performed. More specifically a plurality of rows and a plurality of columns of depressed portions 3a are formed along an outline of the lid substrate wafer 50 in an area except for an outer peripheral portion of the lid substrate wafer 50. For reference sake, as described above, the outer peripheral portion of the lid substrate wafer 50 is an area where the cavities C (see FIG. 3) are not formed because it is used for clamping or the like when bonding the both substrate wafers 40, 50, for example, in a bonding step (S60) described later. In other words, the outer peripheral portion on the lid substrate wafer 50 and an area having no depressed portion 3a corresponds to a non-cavity formed area Y, and an area radially inside the non-cavity formed area Y and having the depressed portions 3a corresponds to a cavity formed area X.

Here, in this embodiment, the piezoelectric vibration reeds 4 are not mounted in the depressed portions 3a formed in the outer peripheral portion in a mounting step (S40), described later, from among the plurality of depressed portions 3a formed in the depressed portion forming step (S22). In other words, the plurality of depressed portions 3a in this embodiment include a plurality of dummy cavities 42 which are cavities arranged along the circumferential direction in the outer peripheral portion of the lid substrate wafer 50 in which the piezoelectric vibration reeds 4 are not mounted and mount cavities 41 surrounded by a dummy area Q in which the dummy cavities 42 are arranged and becoming the cavities C (see FIG. 3) in which the piezoelectric vibration reeds 4 are mounted (mount area P in FIG. 9). In other words, the cavity formed area X described above includes the mount area P formed with the mount cavities 41 formed in the plurality of package forming areas on the lid substrate wafer 50 and the dummy area Q having the dummy cavities 42 arranged therein. For reference sake, what is essential is to arrange the dummy cavities (first dummy cavities) 42 so as to come into contact at least with long sides and short sides on the outer side of the mount cavities 41 arranged in an outermost periphery in the mount area P. However, as in this embodiment, it is further preferable to arrange the dummy cavities (second dummy cavities) 42 which come into contact only with corner portions arranged on the outside of the mount cavities 41 arranged in the outermost periphery of the mount area P.

Subsequently, simultaneously with or a timing before or after the steps described above, a second wafer fabricating step (S30) configured to fabricate the base substrate wafer 40 (see FIG. 10) which becomes the base substrate 2 later to a state immediately before performing the anodic wafer bonding is performed. First of all, after having grinded the soda lime glass to a predetermined thickness and washed the same, the base substrate wafer 40 of a disc shape having the affected layer on the topmost surface thereof removed by etching or the like is formed (S31).

Subsequently, a through electrode forming step (S32) for forming a plurality of pairs of through electrodes 32, 33 on the base substrate wafer 40 is performed. Specifically, a plurality of pairs of through holes 30, 31 penetrating through the base substrate wafer 40 are formed by a sand blasting method or the like.

Subsequently, the core members 7 are arranged in the plurality of through holes 30, 31, and the through holes 30, 31 are filled with a predetermined amount of past-state glass frit formed of glass material, and then baked to secure the cylindrical members 6 and the core members 7 with respect to each other. Subsequently, both main surfaces of the base substrate wafer 40 are ground to be flat surfaces to expose distal ends of the core members 7. With the procedure as described above, the through electrode forming step is ended.

Figure 10:
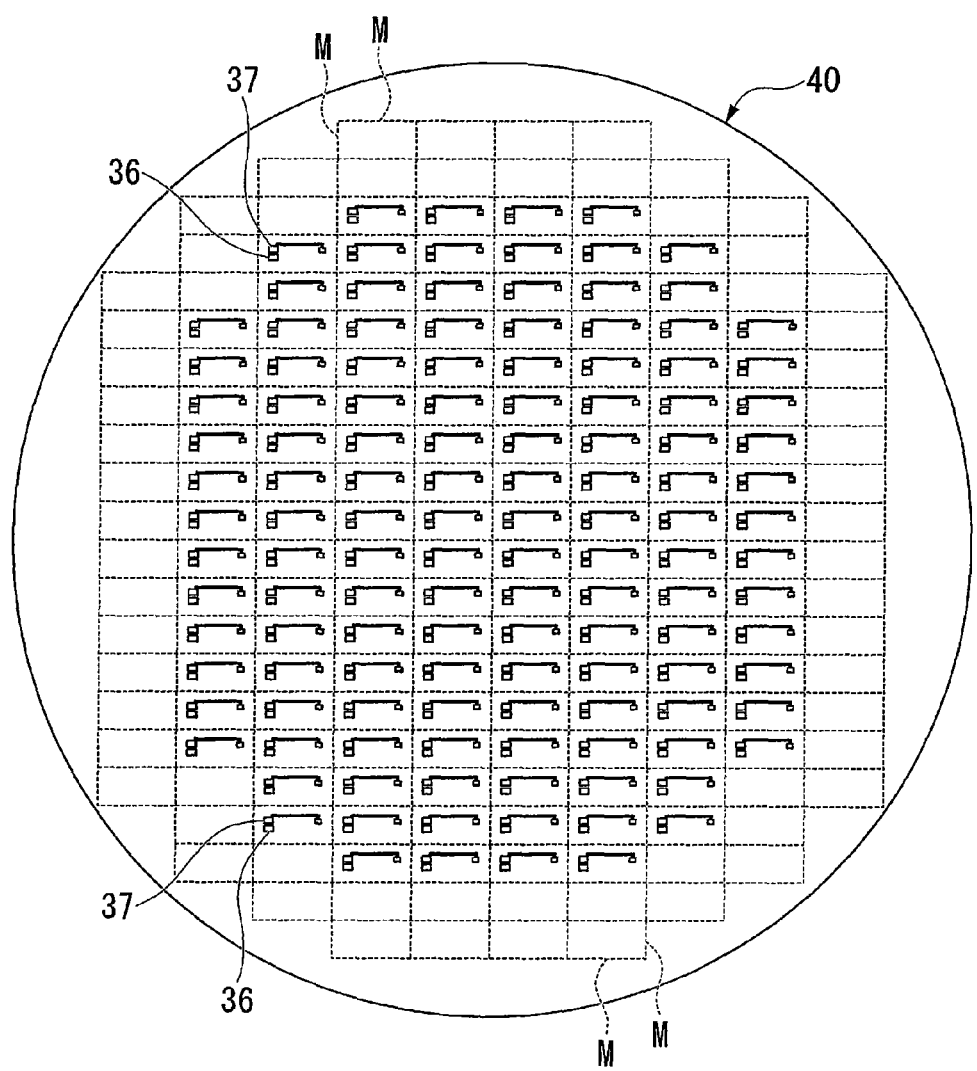
FIG. 10 is a drawing showing a step taken when manufacturing the piezoelectric vibrator according to the flowchart shown in FIG. 8, and is a plan view of a base substrate wafer.

FIG. 10 is a plan view of the base substrate wafer. For reference sake, contour lines M in the drawing show contour lines of the piezoelectric vibrators 1.

Subsequently, a bonding film forming step (S33) for patterning a conductive material and forming the bonding film 35 on an upper surface of the base substrate wafer 40 so as to correspond to the mount cavities 41 from among the respective depressed portions 3a on the lid substrate wafer 50 is performed, and a drawing electrode forming step (S34) for forming a plurality of drawing electrodes 36, 37 electrically connected respectively to one pair each of through electrodes 32, 33 is performed. By performing these processes, the conductivity between the one drawing electrodes 36 and the one through electrodes 32, and the conductivity between the other drawing electrodes 37 and the other through electrodes 33 can be secured. At this time point, the second wafer fabricating step is ended. For reference sake, FIG. 8, the order of the steps is illustrated as performing the drawing electrode forming step (S34) after the bonding film forming step (S33). However, conversely, the bonding film forming step (S33) may be performed after the drawing electrode forming step (S34) or the both steps may be performed simultaneously.

Subsequently, the both wafers 40, 50 are joined in a state in which the piezoelectric vibration reeds 4 are mounted on the base substrate wafer 40, and the piezoelectric vibration reeds 4 are sealed in the plurality of cavities C formed by covering the depressed portions 3a with the base substrate wafer 40 (S40: sealing step).

First of all, a mounting step (S41) for bonding the manufactured plurality of piezoelectric vibration reeds 4 to the upper surface of the base substrate wafer 40 respectively via the drawing electrodes 36, 37 is performed. Specifically, the bumps B formed of gold or the like are formed respectively on the pair of drawing electrodes 36, 37. Then, the base members 12 of the piezoelectric vibration reeds 4 are placed on the bumps B, and then, the piezoelectric vibration reeds 4 are pressed against the bumps B while heating the bumps B to a predetermined temperature. Accordingly, on the base substrate wafer 40, the piezoelectric vibration reeds 4 are mounted in the depressed portions 3a of the mount cavities 41 and, in contrast, the piezoelectric vibration reeds 4 are not mounted in the depressed portions 3a of the dummy cavities 42. Then, the piezoelectric vibration reeds 4 are mechanically supported by the bumps B, while the mount electrodes 16, 17 and the drawing electrodes 36, 37 are electrically connected. Therefore, at this time point, the pair of excitation electrodes 15 of the piezoelectric vibration reeds 4 are brought into a conducting state with respect to the pair of the through electrodes 32, 33.

After having mounted the piezoelectric vibration reeds 4, a superimposing step (S42) for superimposing the lid substrate wafer 50 on the base substrate wafer 40 is performed. Specifically, the both wafers 40, 50 are aligned at a proper position with reference to a reference mark or the like, not shown. Accordingly, a state in which the mounted piezoelectric vibration reeds 4 are stored in the mount cavities 41 (cavities C) surrounded by the depressed portions 3a formed on the base substrate wafer 40 and the base substrate wafer 40 is achieved. In contrast, the piezoelectric vibration reeds 4 are not stored in the dummy cavities 42 surrounded by the depressed portions 3a formed on the outer peripheral portion of a bonded wafer member 60 and the base substrate wafer 40.

Figure 11:
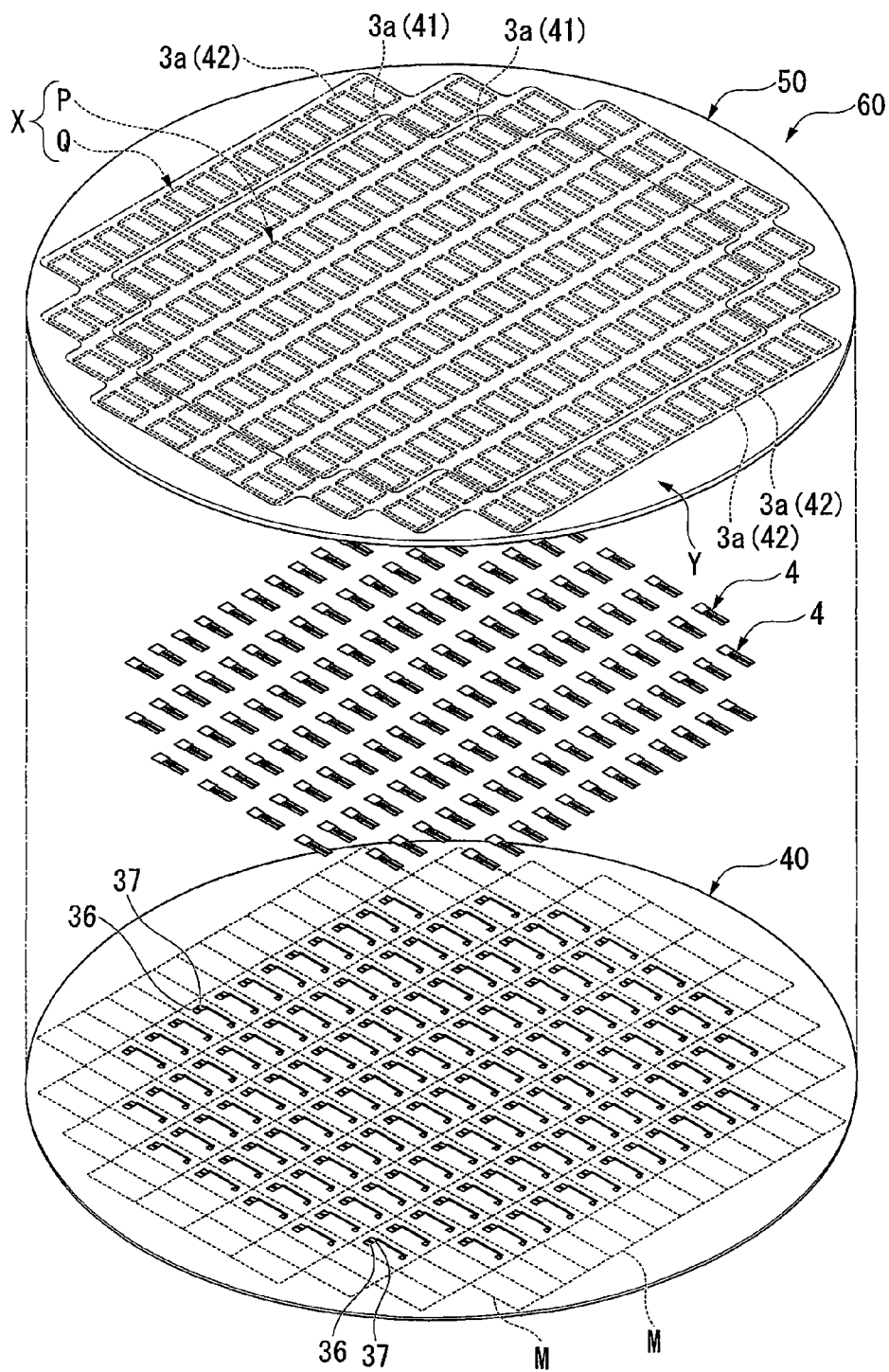
FIG. 11 is a drawing showing a step taken when manufacturing the piezoelectric vibrator according to the flowchart shown in FIG. 8, and is an exploded perspective view of a bonded wafer member obtained by anodically bonding the base substrate wafer and the lid substrate wafer in a state in which the piezoelectric vibration reeds are stored in the cavities.

FIG. 11 is an exploded perspective view of a bonded wafer member obtained by anodically bonding the base substrate wafer and the lid substrate wafer in a state in which the piezoelectric vibration reeds are stored in the cavities.

After having the superimposing step, the two superimposed wafers 40, 50 are put in an anodic wafer bonding apparatus, not shown, and a bonding step (S43) for applying a predetermined voltage in an atmosphere at a predetermined temperature to anodically bond the wafers 40, 50 in a state of clamping an outer peripheral portion of the wafers 49, 50 by a holding mechanism, not shown, is performed. More specifically, a predetermined voltage is applied between the bonding film 35 and the lid substrate wafer 50. Then, an electrochemical reaction occurs in an interface between the bonding film 35 and the lid substrate wafer 50, and the both are tightly adhered to each other and bonded by anodic wafer bonding. Accordingly, the piezoelectric vibration reeds 4 can be sealed in the mount cavities 41, and the bonded wafer member 60 shown in FIG. 11 including the base substrate wafer 40 and the lid substrate wafer 50 bonded to each other can be obtained. For reference sake, in FIG. 11, for the sake of easy understanding of the drawing, a state in which the bonded wafer member 60 is disassembled is illustrated, and illustration of the bonding film 35 is omitted from the base substrate wafer 40.

Then, after having ended the above-described anode wafer bonding, an external electrode forming step (S44) for patterning the conductive material on the lower surface of the base substrate wafer 40 and forming a plurality of pairs of external electrodes 38, 39 connected electrically to the pair of through electrodes 32, 33 respectively is performed. With this step, the sealing step is ended, and hence the piezoelectric vibration reeds 4 sealed in the cavities C can be operated using the external electrodes 38, 39.

Subsequently, in the state of bonded wafer member 60, a fine adjusting step (S50) for fine-adjusting the frequencies of the individual piezoelectric vibrators 1 sealed in the cavities C so as to be kept within a predetermined range is performed. Specifically, the piezoelectric vibration reeds 4 are vibrated by applying a voltage to the pair of external electrodes 38, 39 formed on the lower surface of the base substrate wafer 40. Then, the fine adjustment film 21b of the weight metal film 21 is irradiated with a laser beam from the outside through the lid substrate wafer 50 while measuring the frequency, is brought into evaporation. Accordingly, since the weights of the distal end sides of the pair of vibrating arm portions 10, 11 are changed, the frequencies of the piezoelectric vibration reeds 4 can be fine-adjusted so as to fall within a predetermined range of the nominal frequency.

After having ended the fine adjustment of the frequencies, a cutting step (S60) for cutting the bonded wafer member 60 after having bonded into pieces is performed.

Figure 12:
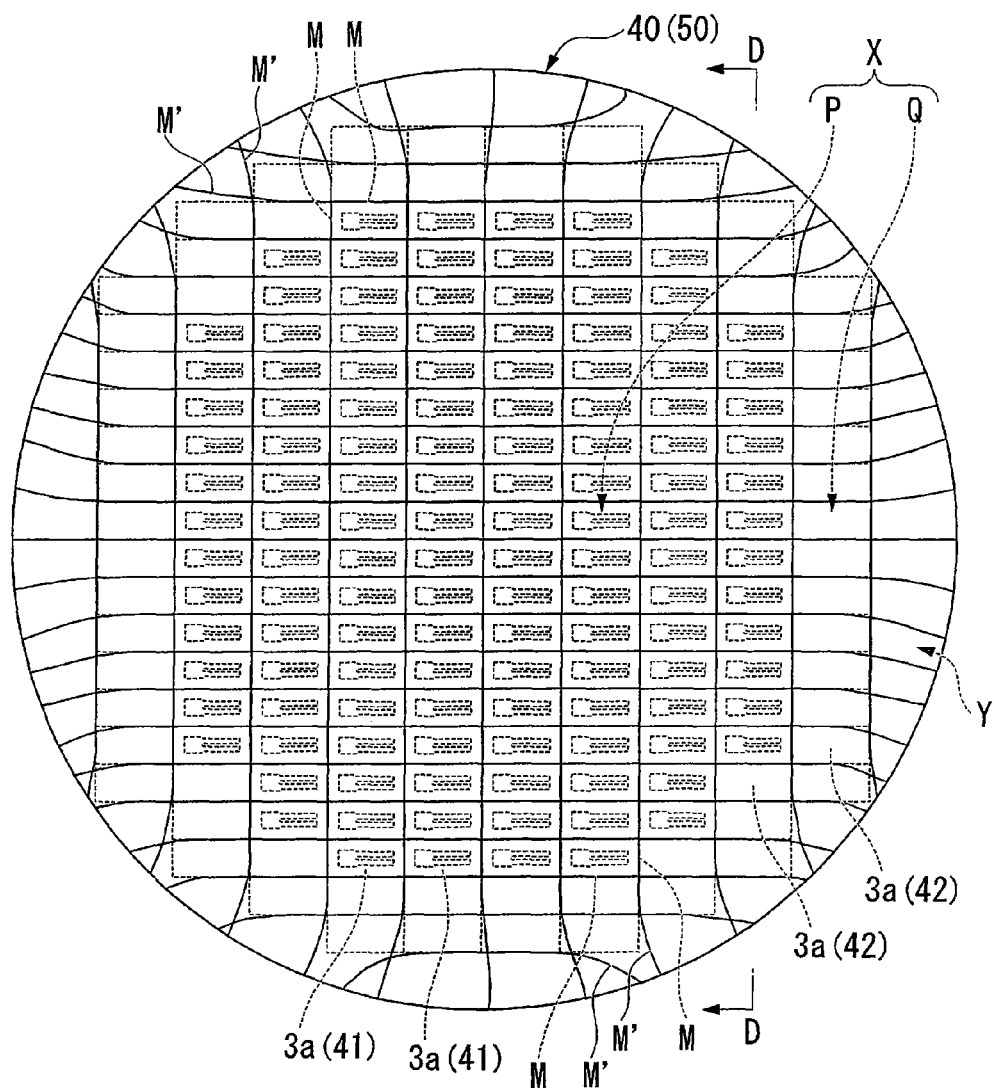
FIG. 12 is a drawing showing a step taken when manufacturing the piezoelectric vibrator according to the flowchart shown in FIG. 8, and is a plan view of the bonded wafer member in a scribing step.

FIG. 12 is a process drawing showing a scribing step, and is a plan view of the bonded wafer member. Also, FIG. 13 is a cross-sectional view taken along the line D-D in FIG. 12.

Figure 13:
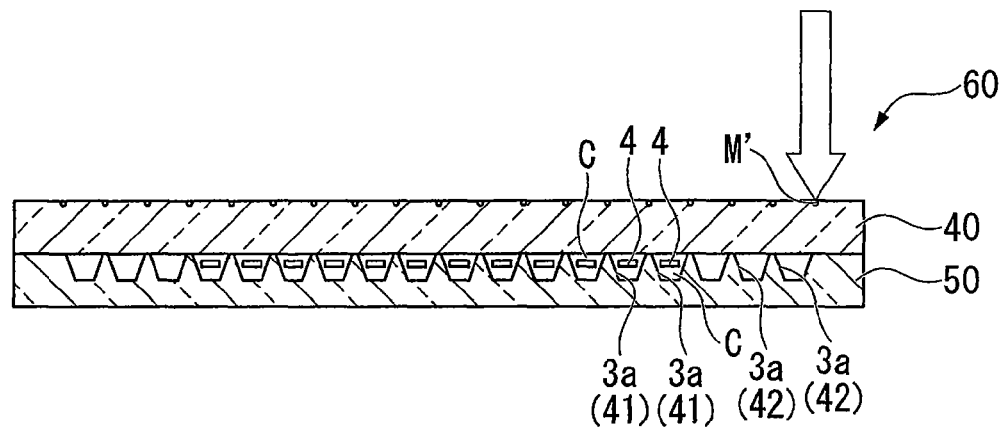
FIG. 13 is a drawing showing a step taken when manufacturing the piezoelectric vibrator according to the flowchart shown in FIG. 8, and is a cross-sectional view taken along the line D-D in FIG. 12 in a cutting step.

As shown in FIGS. 12, 13, in the cutting step (S60), first of all, the base substrate wafer 40 is irradiated with a laser by a laser apparatus, not shown from the front surface side thereof (see an arrow in FIG. 13) to form scribe lines on the front surface of the base substrate wafer 40 (S61: scribing step (groove forming step)). Specifically, the laser apparatus and the bonded wafer member 60 are moved relatively in parallel to scan partitioning walls which partition the respective mount cavities 41, that is, along the contour lines M of the piezoelectric vibrators 1 with the laser. Then, a groove-shaped scribe lines M' are formed at portions of the base substrate wafer 40 irradiated with the laser.

Incidentally, when the laser apparatus is caused to scan along the contour lines M, desired scribe lines M' which correspond to the contour lines M can be formed on the mount cavity 41 at a center portion of the cavity formed area X.

In contrast, the scribe lines M' start to curve with respect to the contour lines M of the piezoelectric vibrator 1 as described above as they about to get into the non-cavity formed area Y from the cavity formed area X.

At this time, in this embodiment, since the depressed portions 3a in an outermost periphery of the bonded wafer member 60 in the cavity formed area X are formed as the dummy cavities 42 where the piezoelectric vibration reeds 4 are not formed, portions where the scribe lines M' start to curve correspond to positions where the scribe lines M' are about to get into the non-cavity formed area Y from the dummy area Q of the dummy cavities 42. In other words, by forming the dummy area Q of the dummy cavities 42 on the radially outside of the mount area P where the mount cavities 41 are arranged, the positions where the scribe lines M' start to curve can be arranged on the radially outside of the mount area P. Accordingly, in the mount area P of the cavity formed area X arranged on the radially inside of the dummy area Q, desired scribe lines M' extending along the contour lines M can be formed. For reference sake, in the dummy area Q where the piezoelectric vibration reeds 4 are not mounted, the scribe lines M' are curved. However, since the dummy cavities 42 in the dummy area Q are not intended to be products, there is no problem even when the scribe lines M' are formed on the cavities.

Figure 14:
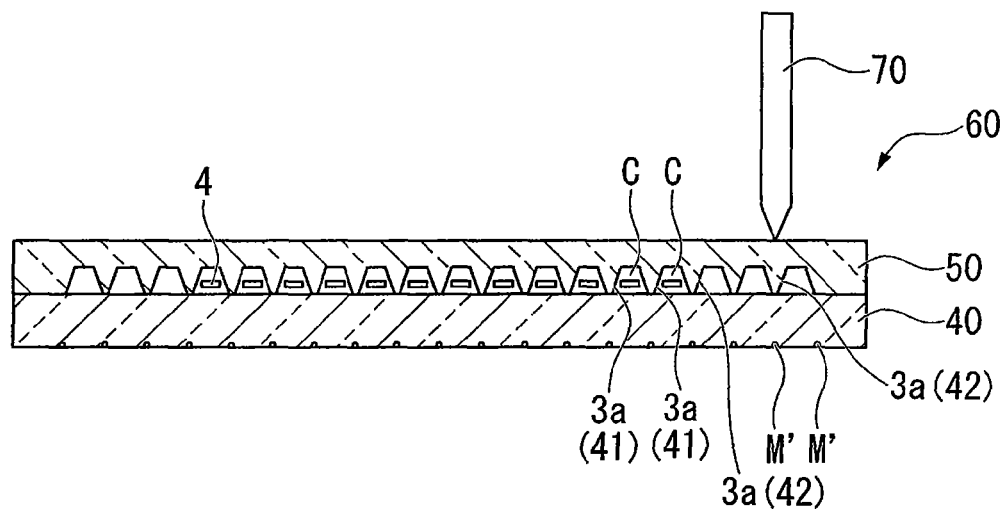
FIG. 14 is a drawing showing a step taken when manufacturing the piezoelectric vibrator according to the flowchart shown in FIG. 8, and is a cross-sectional view taken along the line D-D in FIG. 12 in the cutting step.

FIG. 14 is a process drawing showing a braking step and is a cross-sectional view of the bonded wafer member.

Subsequently, as shown in FIG. 14, a braking step (S62) for cutting the bonded wafer member 60 formed with the scribe lines M' by a cutting blade 70 is performed. Specifically, the cutting blade 70 having a cutting edge length longer than the diameter of the bonded wafer member 60 is prepared, and the cutting blade 70 is pressed against the front surface of the lid substrate wafer 50 so as to align with the scribe lines M' (contour lines M) formed on the mount cavity 41. Accordingly, the bonded wafer member 60 is cut as if it is broken along the scribe lines M' formed on the lid substrate wafer 50. Then, by pressing the cutting blade 70 against each of the scribe lines M' respectively, the bonded wafer member 60 can be separated at once into packages along the respective contour lines M. From the procedure described above, a plurality of the two-layer structure surface mount type piezoelectric vibrators 1 shown in FIG. 1 each having the piezoelectric vibration reed 4 sealed in the cavity C formed between the base substrate 2 and the lid substrate 3 which are anodically bonded to each other can be formed at once. In particular, by using the laser for cutting as in this embodiment, advantages such that the cutting margin is significantly smaller, the cutting speed is higher, and the coarseness of the cutting surface is more preferable, the amount of generated chippings is smaller, and so on in comparison with the cutting method using a blade in the related art are achieved.

Subsequently, an inspection of the electric characteristics in the interior (S70) is performed. In other words, a resonance frequency, a resonant resistance value, drive level characteristics (an excitation power dependency of the resonance frequency and the resonant resistance value) of the piezoelectric vibration reed 4 or the like are measured and checked. Also, the insulative resistance characteristics or the like are also checked. Then, finally, an appearance inspection of the piezoelectric vibrator 1 is performed to finally check dimensions, quality, and the like. Accordingly, manufacture of the piezoelectric vibrator 1 is ended.

In this manner, in this embodiment, a plurality of the depressed portions 3a in the cavity formed area X are formed in the center portion (the mount area P in FIG. 9) of the lid substrate wafer 50, and the mount cavities 41 including the piezoelectric vibration reeds 4 mounted therein and the plurality of dummy cavities 42 formed so as to surround the mount area P (the dummy area Q in the drawing) and having no piezoelectric vibration reeds 4 mounted therein are provided.

In this configuration, by forming the dummy area Q in the cavity formed area X on the radially outside of the mount area P, the positions where the scribe lines M' start to curve can be arranged on the radially outside of the mount area P. Accordingly, in the mount area P arranged on the radially inside of the dummy area Q, desired scribe lines M' extending along the contour lines M can be formed.

Therefore, in a subsequent braking step, in the mount area P, the plurality of packages formed on the bonded wafer member 60 can be cut into pieces of a predetermined size. Therefore, the number of the piezoelectric vibrators 1 taken out from a single piece of the bonded wafer member 60 as conforming articles can be increased, so that the process yield can be improved. In this case, since the piezoelectric vibration reeds 4 and the respective wirings are not formed in the dummy cavities 42 in advance, loss of the material is avoided, and hence the material cost can be reduced.

Also, the piezoelectric vibrators 1 which are not the predetermined size are not manufactured, and only high-performance piezoelectric vibrators 1 can be manufactured. Therefore, defective products are not put into circulation and only the piezoelectric vibrators 1 with high reliability are put into circulation.

Also, in this embodiment, the configuration including the dummy cavities 42 which come into contact only with the corner portions positioned outside the mount cavities 41 formed in addition to the dummy cavities 42 which come into contact with the long sides and the short sides on the outside of the mount cavities 41 positioned in an outermost periphery on the lid substrate wafer 50 is employed. Therefore, the positions where the scribe lines M' start to curve can be arranged reliably radially outside of the mount cavities 41. Therefore, the process yield can be improved further reliably. Then, as in this embodiment, by separating the bonded wafer member 60 formed of the glass substrate into pieces using the laser, preferable cutting surfaces are obtained.

For reference sake, when forming the dummy cavities 42, if a space for newly adding the dummy cavities 42 can be secured on the outside of the mount cavities 41 on the lid substrate wafer 50, it is preferable to use the existing depressed portions 3a as the mount cavities 41 and form the depressed portions 3a for the dummy cavities 42 newly so as to surround the mount cavities 41 from the outside. Accordingly, the number of the conforming piezoelectric vibrators 1 cut into pieces of the predetermined size can be increased while maintaining the number of the piezoelectric vibrators 1 which can be obtained from the single bonded wafer member 60.

In contrast, if the dummy area Q for forming the dummy cavity 42 cannot be secured in the outer peripheral portion of the bonded wafer member 60, the depressed portions 3a arranged in an outermost periphery of the mount cavity 41 can be used as the dummy cavities 42. In this case, since only the conforming piezoelectric vibrators 1 can be manufactured reliably, loss of the material is avoided, and hence the material cost can be reduced.

(Oscillator)

Subsequently, an embodiment of the oscillator according to the present invention will be described with reference to FIG. 15.

Figure 15:
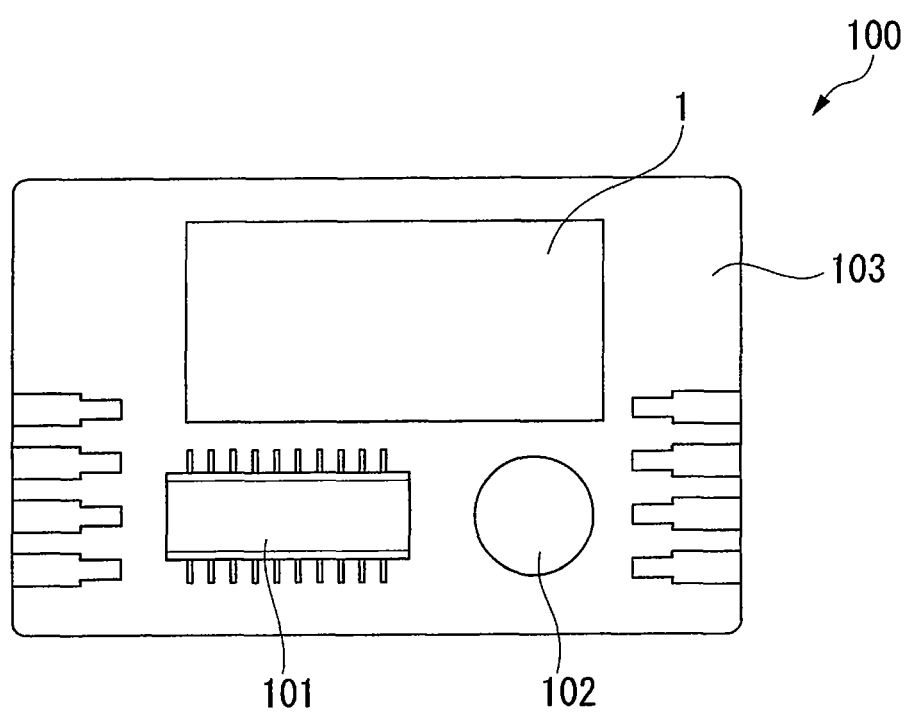
FIG. 15 is a configuration drawing showing an embodiment of an oscillator according to the present invention.

An oscillator 100 in this embodiment includes the piezoelectric vibrator 1 as an oscillation element electrically connected to an integrated circuit 101 as shown in FIG. 15. The oscillator 100 includes a substrate 103 on which an electronic component 102 such as a capacitor is mounted. The integrated circuit 101 as described above for the oscillator is mounted on the substrate 103, and the piezoelectric vibrator 1 is mounted in the vicinity of the integrated circuit 101. The electronic component 102, the integrated circuit 101 and the piezoelectric vibrator 1 are electrically connected to each other with a wring pattern, not shown. For reference sake, the respective components are molded by resin, not shown.

In the oscillator 100 configured as described above, when a voltage is applied to the piezoelectric vibrator 1, the piezoelectric vibration reed 4 in the piezoelectric vibrator 1 vibrates. This vibration is converted into an electric signal by the piezoelectric characteristic of the piezoelectric vibration reed 4 and is inputted to the integrated circuit 101 as the electric signal. The inputted electric signal is subjected to various sorts of processing by the integrated circuit 101, and is outputted as a frequency signal. Accordingly, the piezoelectric vibrator 1 functions as the oscillation element.

Also, by selectively setting the configuration of the integrated circuit 101, for example, a RTC (real time clock) module or the like according to the requirement, not only a function as a single function oscillator for a timepiece, but also a function to control the date of operation or the time instant of the corresponding apparatus or an external apparatus or to provide the time instant or a calendar or the like of the same may be added.

As described above, according to the oscillator 100 in this embodiment, since the piezoelectric vibrator 1 improved in quality is provided, the oscillator 100 by itself can also be improved in quality. In addition, stable and highly accurate frequency signals can be obtained over a long time.

(Electronic Apparatus)

Figure 16:
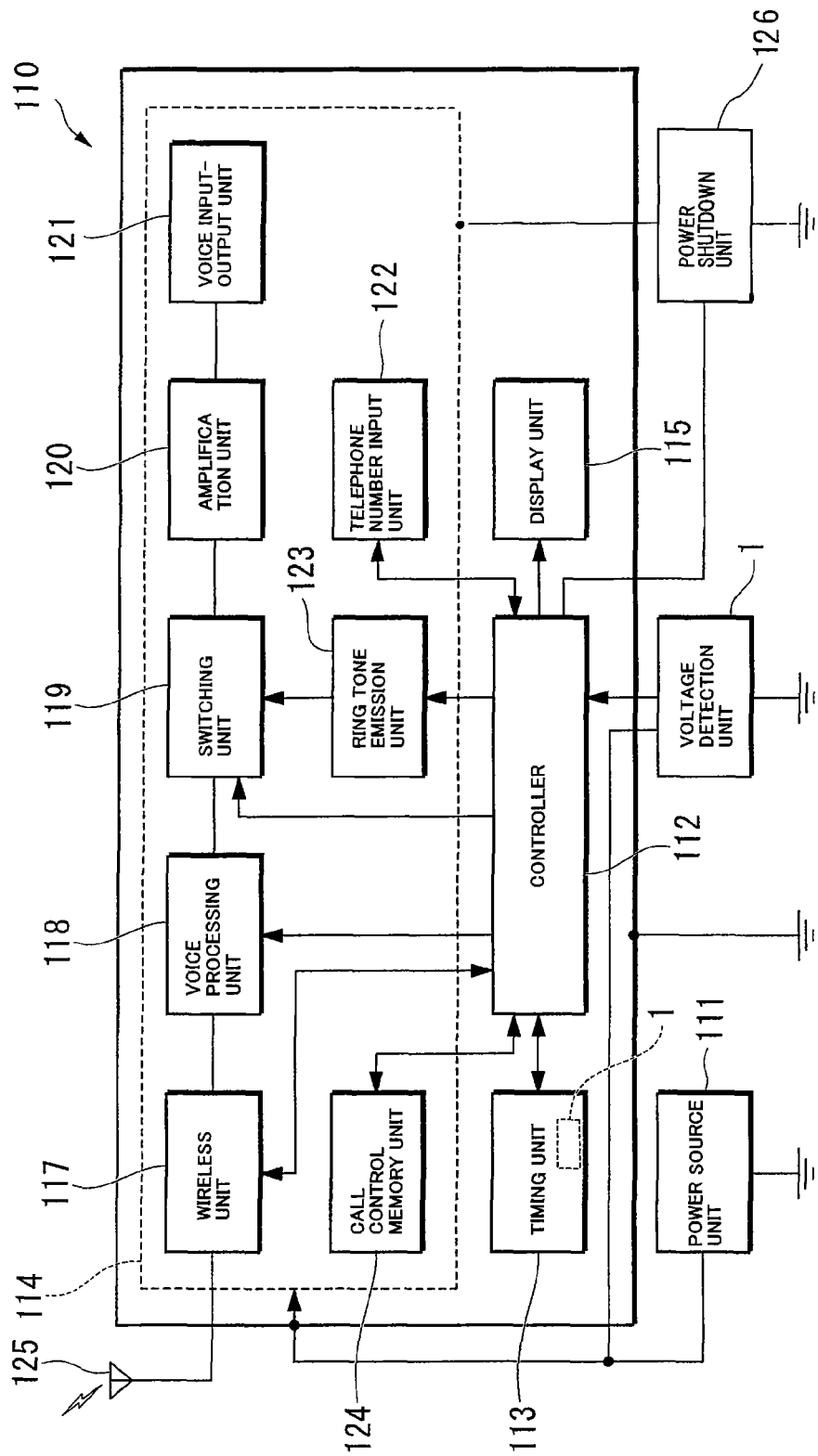
FIG. 16 is a configuration drawing showing an embodiment of an electronic apparatus according to the present invention.

Subsequently, an embodiment of an electronic apparatus according to the present invention will be described with reference to FIG. 16. For reference sake, as the electronic apparatus, a portable digital assistant 110 having the piezoelectric vibrator 1 described above will be exemplified for description. First of all, the portable digital assistant 110 of this embodiment is represented, for example, by a mobile phone set, and is an apparatus obtained as a result of development and improvement of a wrist watch in the related art. The appearance is similar to the wrist watch, and a liquid crystal display is arranged on a portion corresponding to a dial, so that the current time instance or the like can be displayed on a screen thereof. Also, when using as a communication instrument, it is removed from the wrist, and communication as achieved by the mobile phone set in the related art can be performed with a speaker and a microphone built in an inner portion of a band. However, downsizing and weight reduction are achieved significantly in comparison with the mobile phone set in the related art.

Subsequently, a configuration of the portable digital assistant 110 in this embodiment will be described. The portable digital assistant 110 includes the piezoelectric vibrator 1 and a power source unit 111 for supplying electric power as shown in FIG. 16. The power source unit 111 is composed, for example, of a lithium secondary battery. Connected in parallel to the power source unit 111 are a control unit 112 configured to perform various controls, a clocking unit 113 configured to perform clocking of time instance of the day or the like, a communication unit 114 configured to perform communication with the outside, a display unit 115 configured to display various items of information, and a voltage detecting unit 116 configured to detect the voltages of the respective functioning portions. Then, the power source unit 111 is configured to supply electric power to the respective functioning portions.

The control unit 112 controls respective functioning portions to perform action control of an entire system such as sending and receiving of the voice data, or measurement or display of the current time instance. Also, the control unit 112 includes a ROM in which a program is written in advance, a CPU configured to read and execute the program written in the ROM, and a RAM used as a work area of the CPU or the like.

The clocking unit 113 includes an integrated circuit having an oscillating circuit, a register circuit, a counter circuit and an interface circuit or the like integrated therein, and the piezoelectric vibrator 1. When a voltage is applied to the piezoelectric vibrator 1, the piezoelectric vibration reed 4 vibrates, and this vibration is converted into an electric signal by a piezoelectric characteristic of crystal and is inputted to the oscillating circuit as the electric signal. The output from the oscillating circuit is binarized, and is counted by the register circuit and the counter circuit. Then, sending and receiving of the signal with respect to the control unit 112 is performed via the interface circuit, and the current time instance and the current date, or the calendar information and the like are displayed on the display unit 115.

The communication unit 114 has the same function as the mobile phone set in the related art, and includes a wireless unit 117, a voice processing unit 118, a switching unit 119, an amplifying unit 120, a voice input and output unit 121, a telephone number input unit 122, an incoming call ring tone generating unit 123 and a call control memory unit 124.

The wireless unit 117 sends and receives various data such as the voice data with respect to a base station via an antenna 125. The voice processing unit 118 codes and decodes a voice signal inputted from the wireless unit 117 or the amplifying unit 120. The amplifying unit 120 amplifies the signal inputted from the voice processing unit 118 or the voice input and output unit 121 to a predetermined level. The voice input and output unit 121 includes a speaker and a microphone or the like, and reinforces an incoming call ring tone or a receiving voice, or collects the voice.

Also, the incoming call ring tone generating unit 123 generates the incoming call ring tone according to the call from the base station. The switching unit 119 switches the amplifying unit 120 connected to the voice processing unit 118 to the incoming call ring tone generating unit 123 only at the time of the incoming call, so that the incoming call ring tone generated by the incoming call ring tone generating unit 123 is outputted to the voice input and output unit 121 via the amplifying unit 120.

For reference sake, the call control memory unit 124 stores the program relating to communication dialing and incoming call ring tone control. Also, the telephone number input unit 122 includes, for example, numeral keys from 0 to 9 and other keys, and a telephone number or the like of a call target is entered by pressing these numeral keys and the like.

The voltage detecting unit 116 detects a voltage drop when the voltage applied to the respective functional portions such as the control unit 112 or the like by the power source unit 111 falls below the predetermined value, and notifies it to the control unit 112. The predetermined voltage value at this time is a value preset as a minimum voltage for stably operating the communication unit 114 and, for example, is on the order of 3V. The control unit 112, upon reception of the notification about the voltage drop from the voltage detecting unit 116, restricts the operations of the wireless unit 117, the voice processing unit 118, the switching unit 119 and the incoming call ring tone generating unit 123. In particular, the stop of the operation of the wireless unit 117 which consumes a large amount of power is essential. Furthermore, the fact that the communication unit 114 is disabled due to the short of the remaining amount of battery is displayed on the display unit 115.

In other words, the operation of the communication unit 114 may be restricted by the voltage detecting unit 116 and the control unit 112, and this may be displayed on the display unit 115. This display may be a text message, but may be a cross mark on a telephone icon displayed on an upper portion of the display surface of the display unit 115 as a further visceral display.

For reference sake, by providing a power source blocking unit 126 which is capable of selectively disconnect the power source of a portion relating to the function of the communication unit 114, the function of the communication unit 114 can be stopped further reliably.

As described above, according to the portable digital assistant 110 in this embodiment, since the piezoelectric vibrator 1 improved in quality is provided, the portable digital assistant by itself can also be improved in quality. In addition, stable and highly accurate time information can be displayed over a long time.

Subsequently, an embodiment of a radio timepiece according to the present invention will be described with reference to FIG. 17.

Figure 17:
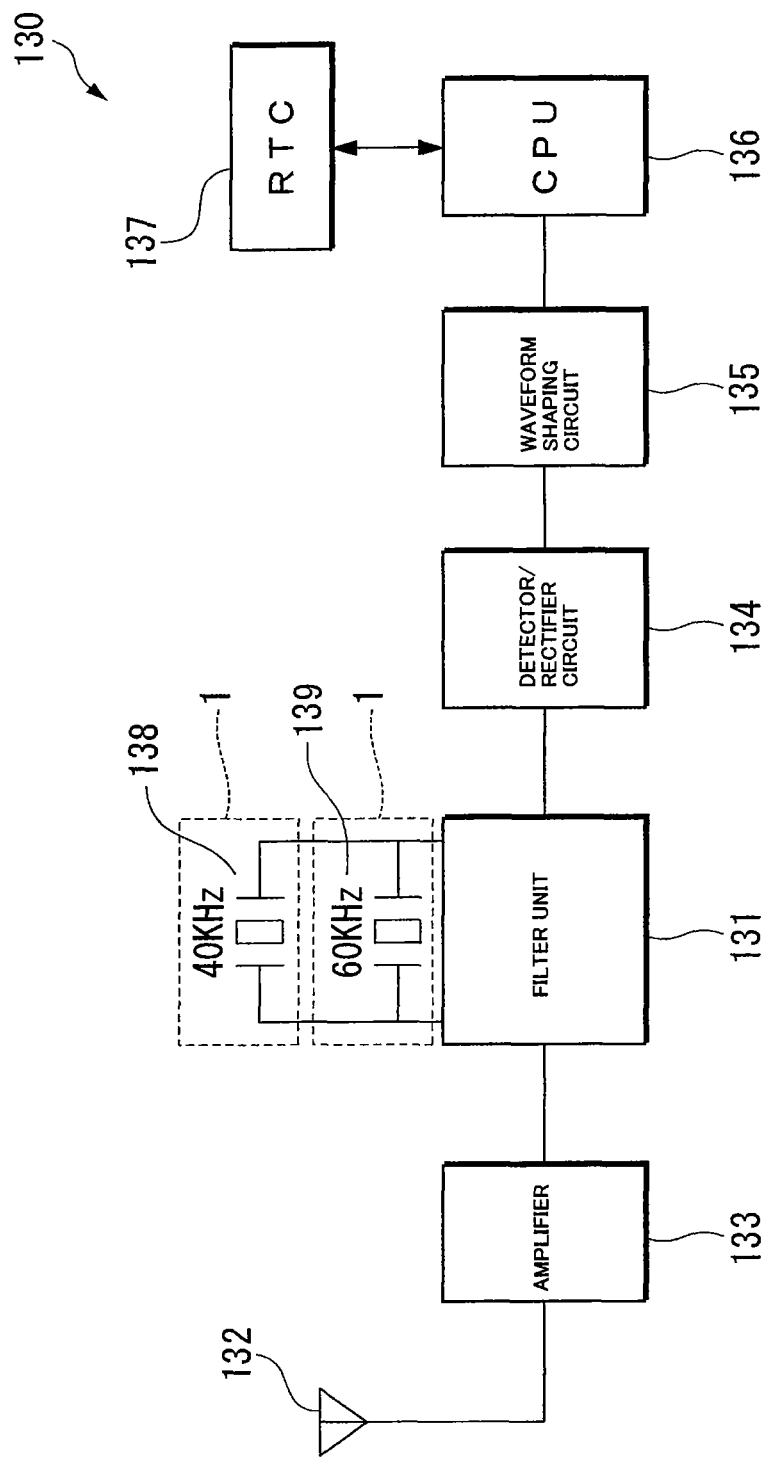
FIG. 17 is a configuration drawing showing an embodiment of a radio timepiece according to the present invention.
Figure 18:
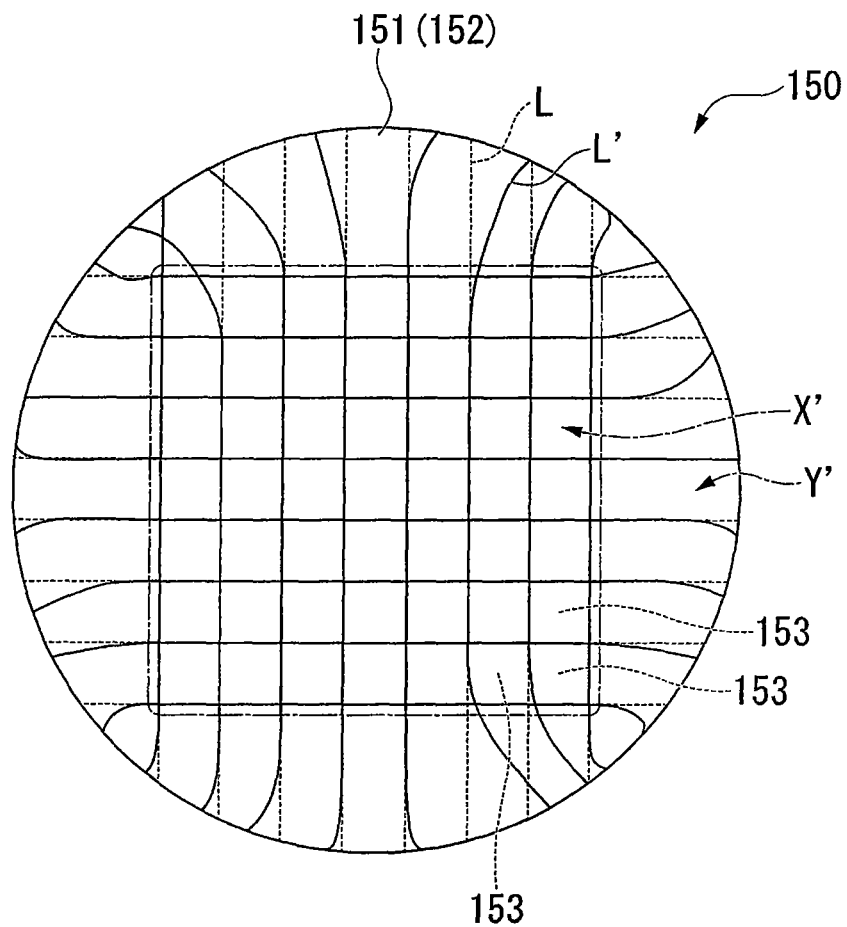
FIG. 18 is a plan view of a bonded wafer member for explaining a method of cutting using a laser in the related art.

A radio timepiece 130 in this embodiment includes the piezoelectric vibrator 1 electrically connected to a filtering unit 131 as shown in FIG. 17, and is a timepiece having functions to receive a standard radio wave including a time information, correct automatically the same to an accurate time instance and display the same.

In Japan, transmitter points (transmitter stations) which transmit the standard radio wave in Fukushima-ken (40 kHz) and Saga-ken (60 kHz), and these stations transmit the standard radio waves respectively. Long radio waves such as 40 kHz or 60 kHz have both a feature to propagate on the ground surface and a feature to propagate while being reflected between the inosphere and the ground surface, so that it has a large propagation range, and hence Japan is entirely covered by the above-described two transmitter stations.

(Radio Timepiece)

A functional configuration of the radio timepiece 130 will be described in detail below.

An antenna 132 receives a long standard radio wave of 40 kHz or 60 kHz. The long standard radio wave is generated by AM modulating the time instance information referred to as a time code into a carrier wave of 40 kHz or 60 kHz. The received long standard radio wave is amplified by an amplifier 133 and filtered and synchronized by the filtering unit 131 having the plurality of piezoelectric vibrators 1.

The piezoelectric vibrators 1 in this embodiment each include quartz vibrator units 138, 139 having a resonance frequency of 40 kHz and 60 kHz which is the same as the above-described carrier frequency.

Furthermore, the filtered signal having the predetermined frequency is detected and demodulated by a detecting and rectifying circuit 134.

Subsequently, the time code is acquired via a waveform shaping circuit 135, and is counted by a CPU 136. In the CPU 136, information such as the current year, the total day, the day of the week, the time instance is read. The read information is reflected on a RTC 137, and the accurate time instance information is displayed.

Since the carrier wave is of 40 kHz or 60 kHz, the quartz vibrator units 138, 139 are preferably vibrators having the tuning fork type structure described above.

For reference sake, the description given above is about the example in Japan and the frequency of the long standard radio wave is different in other countries. For example, in Germany, a standard radio wave of 77.5 KHz is used. Therefore, when integrating the radio timepiece 130 for overseas use into portable equipment, the piezoelectric vibrator 1 having a different frequency from Japan is further necessary.

As described above, according to the radio timepiece 130 in this embodiment, since the piezoelectric vibrator 1 improved in quality is provided, the radio timepiece by itself can also be improved in quality. In addition, stable and highly accurate time instance count is achieved over a long time.

Although the embodiments of the present invention have been described in detail referring to the drawings, detailed configurations are not limited to these embodiments, and modifications in design without departing the scope of the present invention are also included.

For example, although the piezoelectric vibration reed 4 of the tuning fork type is exemplified in the embodiment described above, the invention is not limited to the tuning fork type. For example, a thickness-shear vibration reed may be employed.

Also, although the surface mount type piezoelectric vibrator 1 has been described as an example of the piezoelectric vibrator 1, the invention is not limited to the piezoelectric vibrator 1. In addition, although the embodiment described above, the bonded wafer member formed of glass material has been described as an example, the invention is not limited thereto, and various materials such as silicon wafer or the like may be employed.

Also, in the embodiment described above, the case where the scribe lines M' are formed on the front surface of the base substrate wafer 40 in the cutting step and, on the other hand, the cutting blade 70 is pressed against the front surface of the lid substrate wafer 50 has been described. However, the invention is not limited thereto. For example, it is also possible to form the scribe lines M' on the front surface of the lid substrate wafer 50 and, on the other hand, to press the cutting blade 70 against the front surface of the base substrate wafer 40.

In addition, it is also possible to form the depressed portions 3a on the base substrate wafer 40 and also to form the depressed portions 3a on the both wafers 40, 50 respectively.

Therefore, the number of the packages taken out from the bonded wafer member as conforming articles can be increased, so that the process yield can be improved.

What is claimed is:

1. A method of manufacturing packages having components sealed therein, the method comprising:
    forming an array of device cavities in a package area on a first wafer;
    bonding the first wafer and a second wafer and enclosing the components in the device cavities to form an array of component packages in a bonded wafer member; and
    irradiating the bonded wafer member with a laser and separating the packages,
    wherein forming device cavities further comprises forming dummy cavities outside of an outer perimeter of the array and in an outermost periphery of the first wafer, such that upon bonding the first wafer and the second wafer the dummy cavities are empty, the dummy cavities devoid of components and having substantially the same structure as the device cavities.

2. The method of manufacturing packages according to claim 1, wherein forming the dummy cavities comprises forming first dummy cavities that contact edge sides of the array in the outermost periphery and forming second dummy cavities that contact only corner portions of the array in the outermost periphery.

3. The method of manufacturing packages according to claim 1, wherein the first wafer and the second wafer comprise glass substrates.

4. The method of manufacturing packages according claim 1, wherein separating the packages includes laser irradiating a front surface of the bonded wafer member and forming a groove in the front surface, and
    wherein separating the packages comprises breaking the bonded wafer member by applying an impact force along the groove from a back surface of the bonded wafer member opposite to the front surface.

5. The method of manufacturing packages according to claim 1, wherein forming dummy cavities comprises forming an area of dummy cavities that surround the device cavities.

\* \* \* \* \*